(12) United States Patent
Yao et al.

(10) Patent No.: US 12,327,801 B2
(45) Date of Patent: Jun. 10, 2025

(54) ROBUST MOLD INTEGRATED SUBSTRATE

(71) Applicant: Intel Corporation, Santa Clara, CA (US)

(72) Inventors: Jimin Yao, Chandler, AZ (US); Kyle Yazzie, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 681 days.

(21) Appl. No.: 17/669,265

(22) Filed: Feb. 10, 2022

(65) Prior Publication Data
US 2022/0165686 A1 May 26, 2022

Related U.S. Application Data

(62) Division of application No. 15/845,990, filed on Dec. 18, 2017, now Pat. No. 11,322,455.

(51) Int. Cl.
H01L 23/00 (2006.01)
B29C 70/68 (2006.01)
(Continued)

(52) U.S. Cl.
CPC ............ H01L 23/562 (2013.01); B29C 70/68 (2013.01); H01L 21/486 (2013.01); H01L 23/49827 (2013.01); H01L 23/49838 (2013.01); H01L 23/544 (2013.01); H01L 23/585 (2013.01); H05K 3/108 (2013.01);
(Continued)

(58) Field of Classification Search
CPC .......... H01L 23/562; H01L 21/486; H01L 23/49827; H01L 23/49838; H01L 23/544; H01L 23/585; H01L 23/145; H01L 2223/54426; H01L 23/13; H01L 23/49822; H01L 23/552; B29C 70/68; H05K 3/108; B29K 2063/00; B29L 2031/3481
See application file for complete search history.

(56) References Cited

U.S. PATENT DOCUMENTS

2005/0045358 A1* 3/2005 Arnold .................... H05K 9/003
174/51
2016/0126220 A1* 5/2016 Chen ....................... H01L 25/50
257/737
(Continued)

OTHER PUBLICATIONS

Notice of Allowance for U.S. Appl. No. 15/845,990, dated Jan. 11, 2022.
(Continued)

Primary Examiner — Thanh T Nguyen
(74) Attorney, Agent, or Firm — Essential Patents Group, LLP

(57) ABSTRACT

An apparatus, comprising an Integrated Circuit (IC) package comprising a dielectric, the IC package has a first surface and an opposing second-surface, wherein the first surface is separated from the second surface by a thickness of the IC package, wherein sidewalls extend along a perimeter and through the thickness between the first surface and the second surface, and a structure comprising a frame that extends at least partially along the perimeter of the IC package, wherein the structure extends at least through the thickness of the IC package and inwardly from the sidewalls of the IC package.

20 Claims, 13 Drawing Sheets

(51) Int. Cl.
  *B29K 63/00* (2006.01)
  *B29L 31/34* (2006.01)
  *H01L 21/48* (2006.01)
  *H01L 23/14* (2006.01)
  *H01L 23/498* (2006.01)
  *H01L 23/544* (2006.01)
  *H01L 23/58* (2006.01)
  *H05K 3/10* (2006.01)

(52) U.S. Cl.
  CPC ... *B29K 2063/00* (2013.01); *B29L 2031/3481* (2013.01); *H01L 23/145* (2013.01); *H01L 2223/54426* (2013.01)

(56) References Cited

U.S. PATENT DOCUMENTS

2018/0182726 A1    6/2018  Wagner
2020/0312782 A1*  10/2020  Eid ........................ H01L 24/03

OTHER PUBLICATIONS

Office Action for U.S. Appl. No. 15/845,990, dated Aug. 2, 2021.
Restriction Requirement for U.S. Appl. No. 15/845,990, dated Mar. 4, 2021.

\* cited by examiner

ROBUST MOLD INTEGRATED SUBSTRATE

CLAIM OF PRIORITY

This Application is a Divisional of, and claims priority to, U.S. patent application Ser. No. 15/845,990, filed on Dec. 18, 2017 and titled "ROBUST MOLD INTEGRATED SUBSTRATE", which is incorporated by reference in its entirety for all purposes.

BACKGROUND

Packaging for microelectronic is being driven to smaller form factors at an ever-accelerating pace. Growing mobile and networking markets are the drivers for this trend. For example, ultrathin packages are required as demand for thin mobile devices increases. As manufacturing processes are developed to fabricate ultrathin package substrates and other package elements, handling of the delicate components for package assembly becomes more challenging. Maintaining low cost in package processing is paramount. Ultrasmall and thin package components such as substrates are more prone to breakage and warpage than in the past, causing significant reduction in product yield. Special process tooling is often purchased to avoid damaging the substrates, increasing production line costs. Low yields are also a factor driving packaging cost upwards.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
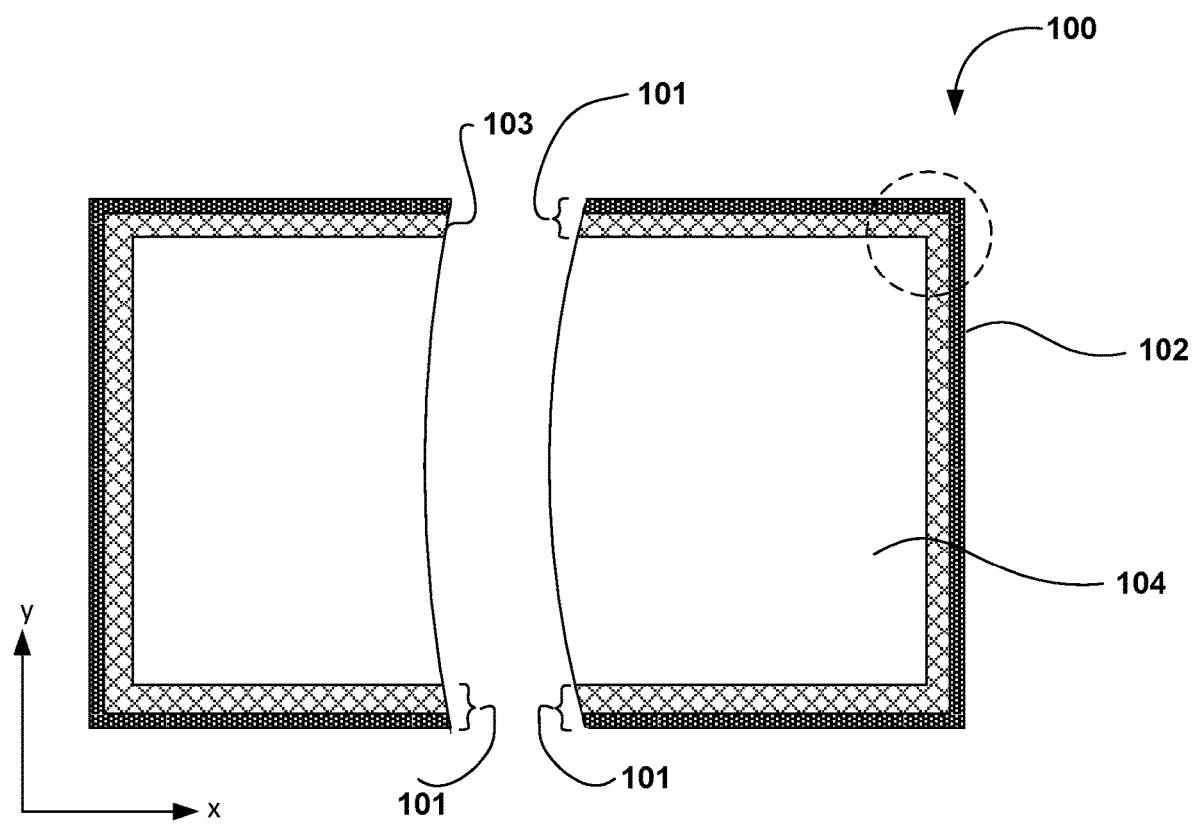
FIG. 1 illustrates a plan view of a mold-integrated substrate (MIS) architecture package substrate unit having a protective frame, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged Integrated Circuits (ICs) and discrete components, forming a larger circuit.

Here, the term "package substrate unit" generally refers to individual package substrates that may be carried with other package substrates in a panel. Package substrate units may be singulated or unsingulated.

Here, the term "panel" generally refers to an array of unsingulated individual package substrate units. The package substrates are processed and undergo package assembly operations en masse, and are generally singulated after assembly is complete. A panel may be mechanically supported on a substrate carrier. The panel may comprise a rectangular array of individual package substrate units.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as vias, signal traces and bond pads. The metallization of a package substrate may be confined to a single layer or in multiple layers separated by layers of dielectric.

Here, the term "via" generally refers to vertical interconnects that penetrate through a dielectric layer to interconnect conductive structures on both sides of the dielectric layer.

Here, the term "frame" generally refers to a protective metal structure disposed along the perimeter of a package substrate or a panel of package substrates.

Here, the term "mesh" generally refers to a lattice structure comprising voids enclosed by intersecting struts.

Demand for low cost and small dimension IC packages is rapidly increasing, requiring IC production lines to have greater capacity for high manufacturing yields and high-volume output. One key to lower microelectronic package costs is the elimination of process bottlenecks to enable high volume manufacturing of IC packages. In microelectronic processing, a particular tool may be employed that can merely perform operations serially instead of in parallel. An example is a laser ablation tool, employed to create vias in package substrates. Here, a single Infrared (IR) laser head fires a beam at one location at a time on a substrate panel. The beam may be drilling holes or creating cavities. Although the hole drilling step is rapid, the process is slowed by the serial nature of the operation. Multiple tools may be used in a process line to process several panels at a time. However, these tools are expensive and require a large capital investment. In general, laser drilling of vias is not conducive to high volume manufacture of IC packaging.

In addition to having serial processing capabilities, a lower limit exists for laser-drilled hole dimensions, as practical laser beam widths for industrial laser cutting and drilling can be reduced to about 10 microns. However, vias formed by laser drilling are significantly larger than this limit, as de-smear operations are required to remove ablation material inside and around the hole, increasing the hold diameter by a large factor. Demand for shrinking package footprint as well as thickness is putting pressure on package architects to design high density metallization architectures where bond pad dimensions are approaching 10 microns. A hallmark of these package architectures is very compact contact pad pitch, for example, sub-30 micron pitch for flip-chip ball grid arrays and other bond pad arrays, that is fast becoming an industry standard. To accommodate high-density metallization architectures, lithographic techniques for via formation are beginning to replace laser drilling methods, as via diameters must eventually be less than what laser drilling is capable of producing. However, some lithographic methods that are currently being explored for high density via production have their own set of limitations. These limitations may prevent them from finding their way into high volume manufacture processes for IC packages.

One recent advancement in package processing to address the aforementioned challenge is the introduction of mold integrated substrate (MIS) architecture of package substrates. This innovative processing methodology eliminates the need for laser-drilled vias. The method creates lithographically defined metallization directly on a substrate carrier. A dielectric is molded over the metallization layer. This process may be repeated to build up a multiple layer substrate. Vias are formed in the metallization to interconnect subsequent, then embedded in the molded dielectric material. This process eliminates the need to create holes in an existing dielectric layer first, then electroplating metal into the hole.

In MIS processes, the vias are electroplated first into lithographically defined holes etched in a sacrificial photoresist using known techniques. The dielectric is then flowed as a liquid and molded around the vias. Another advantage inherent in MIS architecture is that it is an additive process, therefore fewer lithographic steps are needed in contrast to conventional methods that are semi-additive. MIS processing bears with it significant cost savings over conventional laser drilling to make via holes.

One drawback to the MIS process is that the molded substrate dielectric is thin and brittle, making handling difficult. To minimize damage to the fragile substrates during package assembly, panels (e.g., strips) containing one or more package units are mounted on substrate carriers, providing mechanical support. The use of a carrier for package assembly engenders extra cost of carrier fabrication and handling tool purchases.

To enable low cost fabrication, it would be beneficial to develop a robust MIS package architecture meeting no-carrier assembly process requirements. Described herein is a robust MIS package architecture that addresses and overcomes the concerns raised above regarding current MIS package architectures, enabling low cost, high-volume MIS package processing. According to some embodiments of this disclosure, the architecture employs an integrated protective frame structure at two levels, both at the package panel level and at the package unit level. At the package panel level, a first protective frame structure encompasses the entire panel along its perimeter. At the package unit level, the individual package units each are encompassed by a second protective frame structure disposed along the perimeters of the individual package units.

According to some embodiments, the protective frame comprises three zones. A first zone is disposed at the outermost portions of the frame, extending from the outer edge of the frame inwardly by a first distance. The first zone may be referred to as a "bumper" zone in this disclosure. A second zone extends inwardly a second distance from the first zone. According to some embodiments, the second zone comprises a mesh structure. In some embodiments, the mesh structure comprises a lattice of struts intersecting at right angles, forming an array of rectangular voids. In some embodiments, the struts intersect at both obtuse and acute angles, forming an array of rhombic shaped voids. According to some embodiments, the voids are filled by a dielectric material, such as the molded dielectric epoxy resin.

According to some embodiments, a third zone extends inwardly a third distance from the second zone. In some embodiments, the third zone overlaps the second zone. In some embodiments, the third zone overlaps the first zone. According to some embodiments, the third zone comprises one or more clean zones surrounding one or more fiducial alignment marks.

According to some embodiments, the protective frame comprises a material having a fracture toughness greater than that of the substrate dielectric material. In some embodiments, the protective frame comprises a metal such as copper. The MIS architecture described herein provides a solution to prevent cracks and other damage due to handling during package assembly from propagating into the active regions of the package substrate units. The protective frame structure compensates the brittleness and fragility of the dielectric material used in MIS fabrication. By mitigating the risk of damage to the package units by the described architecture, no-carrier handling of ultrathin MIS packages, crack-free assembly and low-cost package fabrication are enabled.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1 illustrates a plan view of MIS architecture package substrate unit 100 having a protective frame, according to some embodiments of the disclosure.

In FIG. 1, MIS package substrate unit 100 comprises protective frame 101. Protective frame 101 comprises first zone 102 and second zone 103. Protective frame 101 extends along the perimeter of package substrate unit 100. In some embodiments, protective frame 101 extends along all four sides of package substrate unit 100, surrounding inner region 104. In some embodiments, inner region 104 comprises a dielectric material. In some embodiments, protective frame 101 extends on fewer than four sides of package substrate unit 100, partially surrounding inner region 104. In some embodiments, first zone 101 is a solid structure, having no openings. In some embodiments, first zone 101 has openings. In some embodiments, second zone 103 is a mesh structure. In some embodiments, the mesh structure of second zone 103 comprises a lattice structure comprising voids (shown in FIG. 2). In some embodiments, second zone 103 comprises a dielectric material within the voids.

In some embodiments, first zone 102 and second zone 103 comprise a metal, such as, but not limited to, copper, alloys of copper, nickel and gold. In some embodiments, first zone 102 and second zone 103 comprise a polymer. In some embodiments, first zone 102 and second zone 103 comprise the same metal. In some embodiments, the dielectric material in the voids of second zone 103 and inner region 104 comprises an epoxy resin. In some embodiments, the dielectric material in the voids of second zone 103 and inner region 104 comprises a composite comprising an inorganic silica filler. In some embodiments, the voids of second zone 103 comprises a ceramic material.

In some embodiments, first zone 102 and second zone 103 of protective frame 101 comprise a material having a fracture toughness that is greater than the dielectric in inner region 104 and within the voids of second zone 103. As an example, copper has a fracture toughness ($K_{Ic}$ between 26 to 79 MPa-m$^{1/2}$. In contrast, the fracture toughness of a typical polymeric dielectric is approximately 1 MPa-m$^{1/2}$. Ceramic dielectrics have fracture toughness values ranging up to 5 MPa-m$^{1/2}$. Fracture toughness is a measure of a material's resistance to fracturing and crack propagation. It is related to the Young's modulus of the material, as well as the material's plasticity. As explained below, fracture toughness of protective frame 101 is germane to its function as a stress buffer zone, protecting the dielectric of inner region 104 from damage due to handling.

Figure 2:
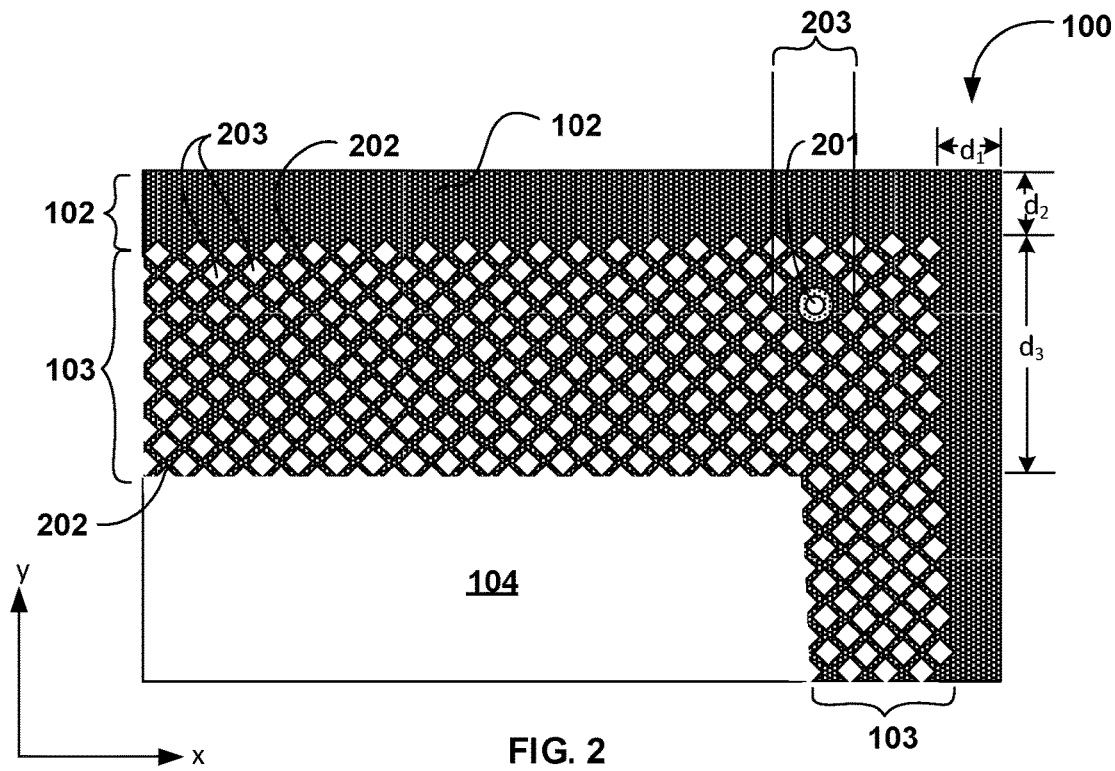
FIG. 2 illustrates a magnified plan view of the circled region of a MIS package substrate unit (circled area in FIG. 1), according to some embodiments of this disclosure.

FIG. 2 illustrates a magnified plan view of a region of MIS package substrate unit 100 (circled area in FIG. 1), according to some embodiments of this disclosure.

In FIG. 2, the circled area of FIG. 1 is magnified to show details of protective frame 101, as magnified region of MIS package substrate unit 100. First zone 102 extends from the edge of MIS package substrate unit 100 inwardly toward the interior of package substrate unit 100 by a distance $d_1$. In some embodiments, first zone 102 extends inwardly from one edge by a distance $d_1$ and from an orthogonal edge by a distance $d_2$. In some embodiments, distance $d_1$ and $d_2$ are substantially equal.

Second zone 103 is shown as comprising a mesh structure extending a distance d3 from first zone 102. In some embodiments, the mesh structure comprises a lattice of struts 202 and voids 203. In some embodiments, struts 202 intersect at right angles. In some embodiments, struts 202 intersect at obtuse angles and acute angles. In some embodiments, struts 202 comprise a metal or a polymer, as described above. Voids 203 are enclosed by intersecting struts 202. In some embodiments, voids 203 are rectangular, as shown in the illustrated embodiment of FIG. 2. In some embodiments, voids 203 are rhomboidal. In some embodiments, voids 203 have curved sections. In some embodiments, voids 203 comprise a dielectric material, as described above for FIG. 1.

Third zone 203 is shown as a region within third zone 103. In some embodiments, third zone 203 is a region surrounding an alignment structure, such as fiducial mark 201. In some embodiments, third zone 203 overlaps with second zone 103, as shown in the illustrated embodiment of FIG. 2. In some embodiments, third zone 203 extends inwardly from second zone 103. In some embodiments, a zigzag or meandering line separates second zone 103 from first zone 102, and inner region 104, as the mesh structure of second zone 103 abuts first zone 102 and inner region 104.

Inner region 104 is the functional area of package substrate unit 100. Protective frame 101, comprising first zone 102, second zone 103 and third zone 203, serves as a protective structure to absorb stresses and strains imposed on package substrate unit 100 by handling during package assembly. As explained below, protective frame 101 protects inner region 104 from cracks propagating from the edge regions of package substrate unit 100. Inner region 104 may comprise metallization structures, such as bond pads, traces and vias, embedded in dielectric material.

Figure 3:
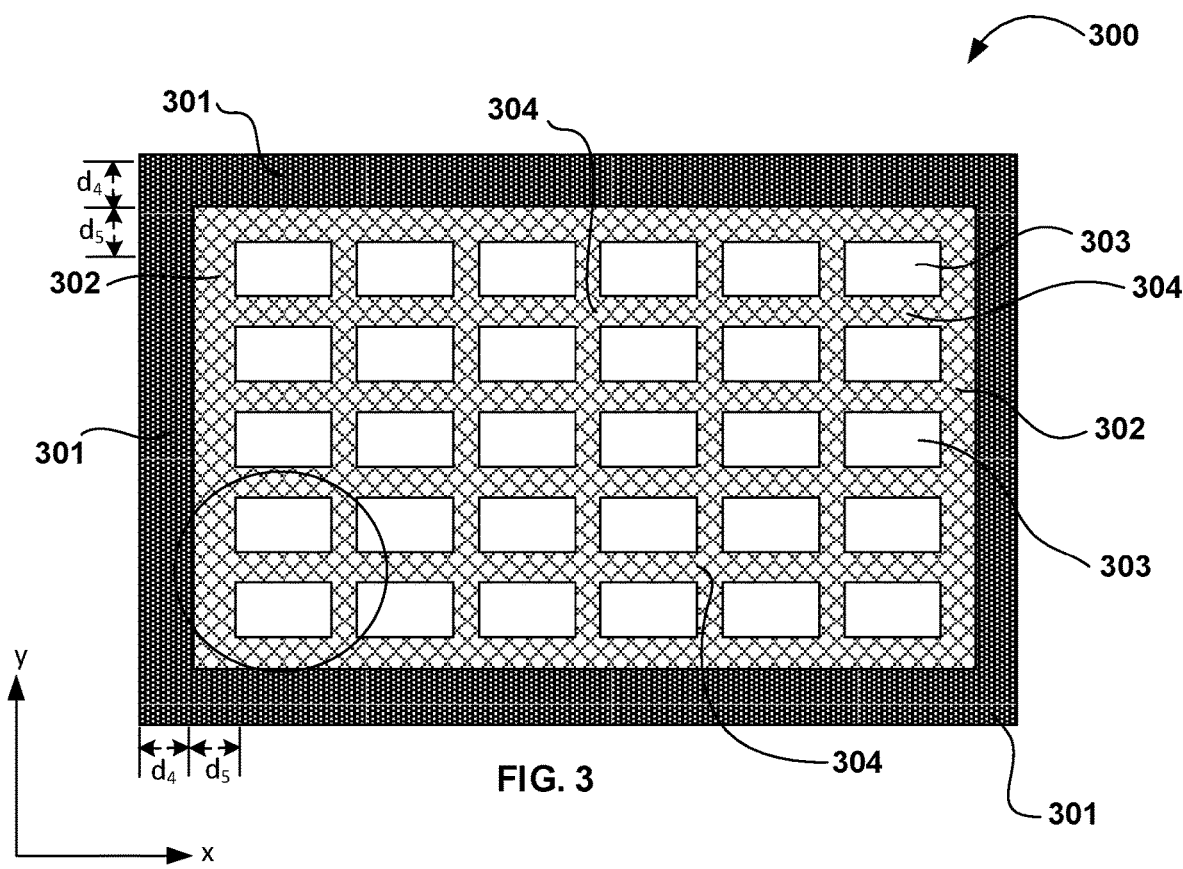
FIG. 3 illustrates a plan view of a MIS package substrate panel having a protective frame, according to some embodiments of this disclosure.

FIG. 3 illustrates a plan view of MIS package substrate panel 300 having a protective frame, according to some embodiments of this disclosure.

Figure 4:
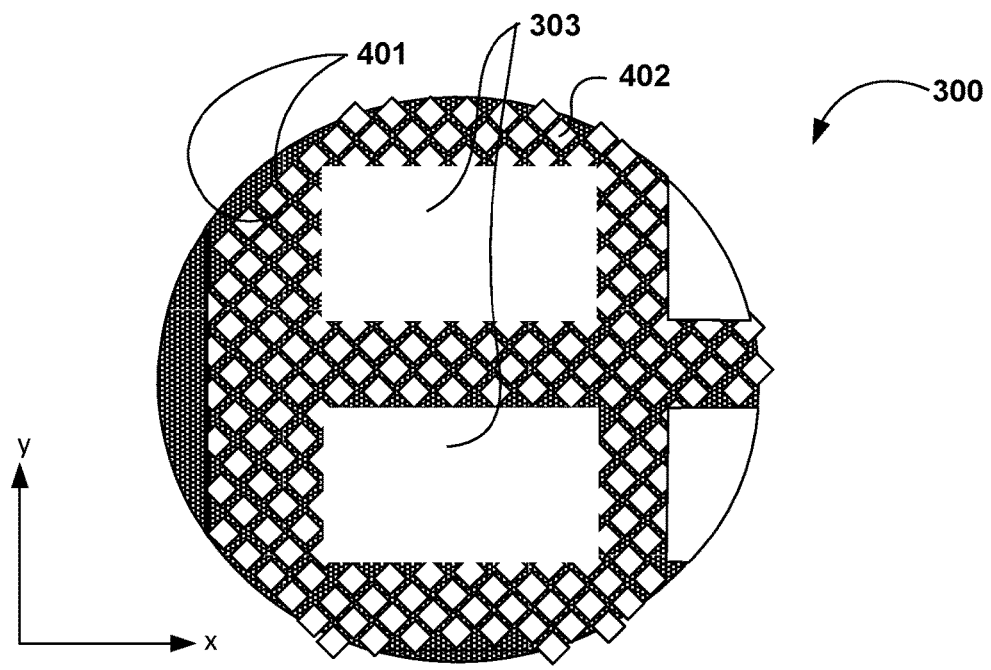
FIG. 4 illustrates a magnified plan view of the details of a region in FIG. 3, according to some embodiments of this disclosure.

In FIG. 3, MIS package substrate panel 300 comprises bumper zone 301, extending along the perimeter of panel 300, mesh zone 302, extending inwardly from bumper (first) zone 301, and an array of one or more package substrate units 303. Mesh network 304 extends from mesh zone 302 and distributes around individual package substrate units 303 as a macro-mesh. In some embodiments, bumper zone 301 extends inwardly from the edges of package substrate panel 300 a distance $d_4$. In some embodiments, mesh zone 302 extends inwardly from bumper zone 301 by a distance $d_5$. In some embodiments, bumper zone 301 is a solid structure. In some embodiments, mesh zone 302 comprises a lattice structure. The area circled is representative of the structures comprised by MIS package substrate panel, and details of the structures that are encompassed within the circled area are shown in FIG. 4.

Mesh zone 302 and individual package substrate units 303 comprise a dielectric material, such as, but not limited to, an epoxy resin, a ceramic or a silica composite. Bumper zone 301 and mesh zones 302 and (mesh network) 304 comprises a material having a fracture toughness greater than that of the dielectric material. In some embodiments, bumper zone 301 and mesh zones 302 and 304 comprises a material such as, but not limited to, copper, alloys of copper, nickel, gold, polymer and polymer composites.

Individual package substrate units 303 comprise metallization structures and dielectric, according to some embodiments. In some embodiments, the metallization structures comprised by package substrate units 303, such as bond pads, traces and vias, are part of the metallization network that includes bumper zone 301, mesh zone 302 and mesh network 304.

According to some embodiments, MIS package substrate panel 300 is a thin structure, as the metallization layer has a thickness ranging between 50 and 500 microns. During package assembly, the protective frame comprising bumper zone 301 and mesh zone 302 enable MIS package substrate panel 300 to be manipulated without a supporting carrier. In some assembly operations, described in greater detail below, MIS package substrate panel 300 may be clamped along the edges, placing mechanical stress on bumper zone 301. Stresses imposed on MIS package substrate panel 300 by the clamping pressure may be absorbed by bumper zone 301. In addition, bumper zone 301 may intercept shocks due to dropping and rough handling, preventing the stress forces from being transferred to the brittle dielectric areas of package substrate units 303.

FIG. 4 illustrates a magnified plan view of the details of the encircled region of MIS package substrate panel 300 in FIG. 3, according to some embodiments of this disclosure.

In FIG. 4, a portion of mesh zones 302 and mesh network 304 (encircled in FIG. 3) are shown in detail. In the illustrated embodiment, struts 401 intersect at right angles, enclosing voids 402. In some embodiments, voids 306 are rectangular, as shown in the illustrated embodiment of FIG. 4. In some embodiments, struts 401 intersect at obtuse angles and acute angles. In some embodiments, voids 402 are rhomboidal. In some embodiments, voids 402 have curved sections. In some embodiments, voids 402 are filled with a dielectric material, as described above. In some embodiments, voids 402 comprise an epoxy resin, a ceramic or a silica composite. In some embodiments, struts 401 comprise a metal or a polymer, as described in detail above. In some embodiments, struts 401 comprise copper, alloys of copper, nickel, gold or a polymer.

Mesh zone 302 and mesh network 304 protect individual package substrate units 303 from propagation of stress cracks that may originate near the edges of MIS package substrate panel 300, due to clamping forces or other handling damage, such as shock due to dropping or other mishandling. This function will be described below (see FIGS. 7A-7E).

Figure 5:
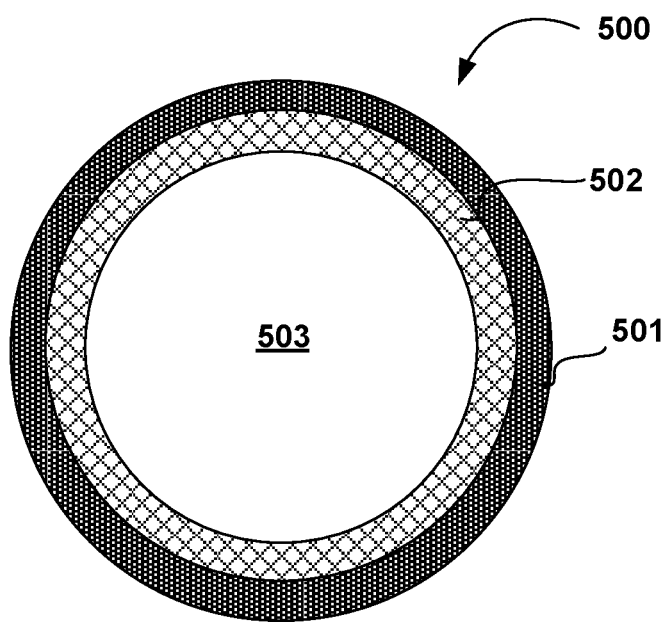
FIG. 5 illustrates a plan view of a round MIS architecture package substrate unit having a protective frame, according to some embodiments of the disclosure.

FIG. 5 illustrates a plan view of round MIS architecture package substrate unit 500 having a protective frame, according to some embodiments of the disclosure.

In FIG. 5, an example of a non-rectilinear package substrate geometry is shown. Round MIS package substrate unit 500 comprises circular bumper zone 501, circular mesh zone 502 intervening between bumper zone 501 and surrounding circular package dielectric zone 503. Package interconnect metallization may be confined to dielectric zone 503. In mesh zone 502, intersecting struts enclose islands of dielectric, as shown in FIGS. 2 and 4. In some embodiments, round MIS package substrate unit 500 may be incorporated into a wristwatch.

Figure 6:
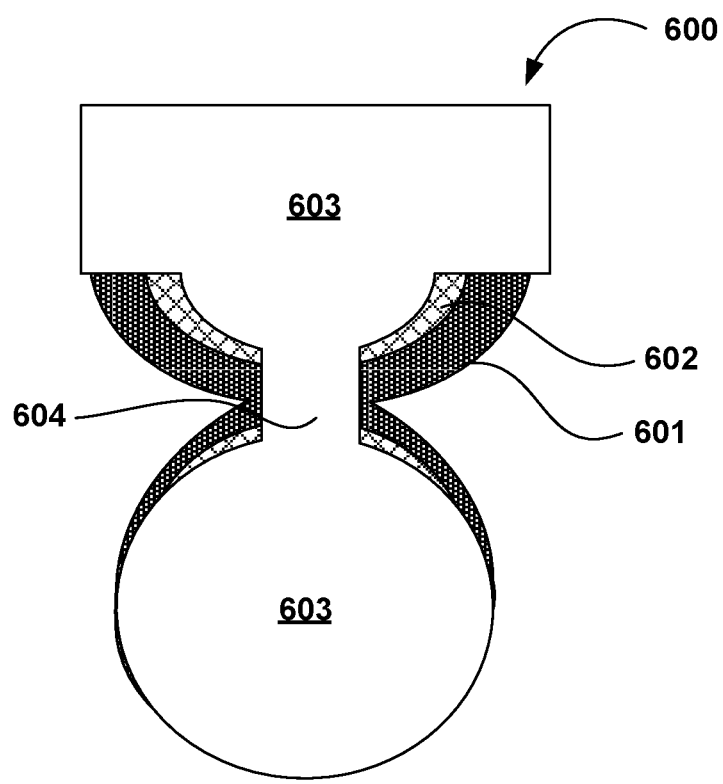
FIG. 6 illustrates a plan view of a MIS architecture package substrate unit having a partial protective frame, according to some embodiments of the disclosure.

FIG. 6 illustrates a plan view of MIS architecture package substrate unit 600 having a partial protective frame, according to some embodiments of the disclosure.

In examples of more complex MIS package substrate geometries, full perimeter protection may not be necessary. In some embodiments, a partial protective frame structure is used to reinforce and protect the substrate in vulnerable regions. In FIG. 6, an example of non-rectilinear package substrate geometry is shown, having a partial protective frame. MIS architecture package substrate unit 600 comprises bumper zone 601 mesh zone 602 and package dielectric zone 603. In some embodiments, dielectric zone comprises a neck 604, which bridges between two round or arbitrary-shaped package substrate portions. Due to its size, neck 604 may be the part of MIS package substrate unit 600 most vulnerable to strain-related breakage or cracking that may occur during assembly and in a device. The protective frame structure comprising bumper zone 601 and mesh zone 602 abut portions of dielectric zone 603 in the region of neck 604, and provide reinforcement and protection against crack propagation specifically for the vicinity of neck 604.

Figure 7:
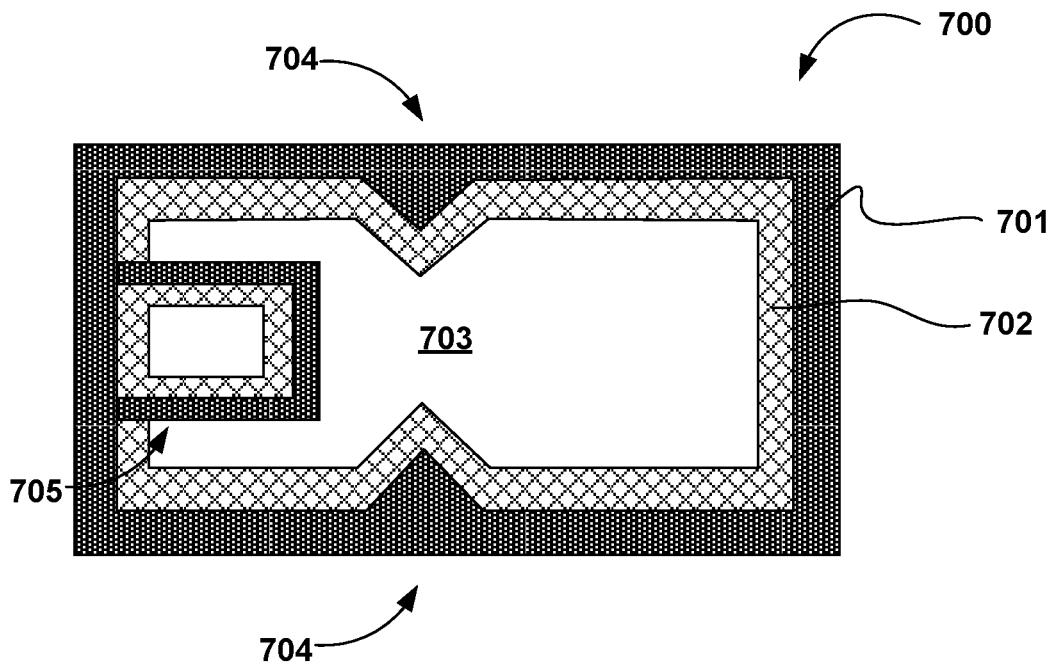
FIG. 7 illustrates a plan view of a high-aspect ratio MIS architecture package substrate unit having a protective frame comprising finger extensions, according to some embodiments of the disclosure.

FIG. 7 illustrate a plan view of high-aspect ratio MIS architecture package substrate unit 700 having a protective frame comprising finger extensions, according to some embodiments of the disclosure.

In FIG. 7, an example of a protective frame applied to a high-aspect ratio MIS architecture package substrate unit (700) is shown. In the illustrated embodiment, the protective frame comprising bumper zone 701 and mesh zone 702 extend along the full perimeter of high-aspect ratio MIS architecture package substrate unit 700, surrounding dielectric zone 703. In some embodiments, extensions 704 are fingers that extend away from the perimeter into dielectric zone 703. In the region of extensions 704, bumper zone 701 is widened to provide greater mechanical strength at a position of dielectric zone 703 that may be vulnerable to cracking and breakage.

In some embodiments, extensions 704 may be finger extensions reinforcing the high-aspect ratio package substrate to withstand stresses and strains that may be sustained during assembly handling. In some embodiments, extensions 704 may extend further from the perimeter than shown in FIG. 7, and compartmentalize portions of dielectric zone 703. In some embodiments, bumper zone 701 and mesh zone 702 are electrically grounded, providing electronic shielding and ground planes in portions of high aspect ratio MIS package substrate unit 700. In the illustrated embodiment, extension 705 isolates a region of dielectric zone 703. In some embodiments, extension 705 isolates an integrated circuit by providing an electrically grounded in-plane shield. It is noted that grounding the protective frame is an additional feature of the earlier embodiments. In some embodiments, bumper zone 701 is widened to accommodate assembly tool clamps as grasping zones during package assembly.

Figure 8:
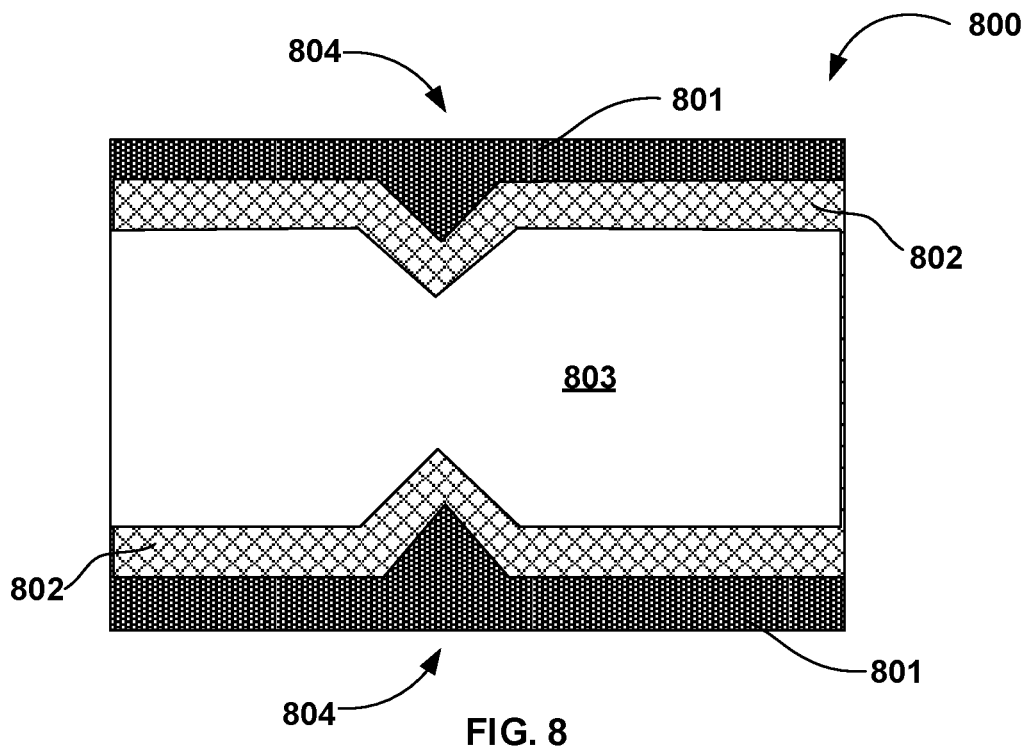
FIG. 8 illustrates a plan view of a MIS package substrate unit having a partial protective frame comprising extensions for warpage control, according to some embodiments of the disclosure.

FIG. 8 illustrates a plan view of MIS package substrate unit 800 having a partial protective frame comprising extensions for warpage control, according to some embodiments of the disclosure.

In some embodiments, the protective frame structure comprises bumper zone 801 and mesh zone 802 partially extending along the perimeter of MIS package substrate unit 800. Extensions 804, comprising a portion of bumper zone 801 and a portion of mesh zone 802, extend away from the perimeter into dielectric zone 803. In some embodiments, bumper zone 801 is widened in the region of extensions 804. In some embodiments, extensions 804 counteract warpage in dielectric zone 803. In some embodiments, extensions 804 act in concert with bumper zone 801 and mesh zone 802 to counteract natural warpage of dielectric zone 803.

Figure 9:
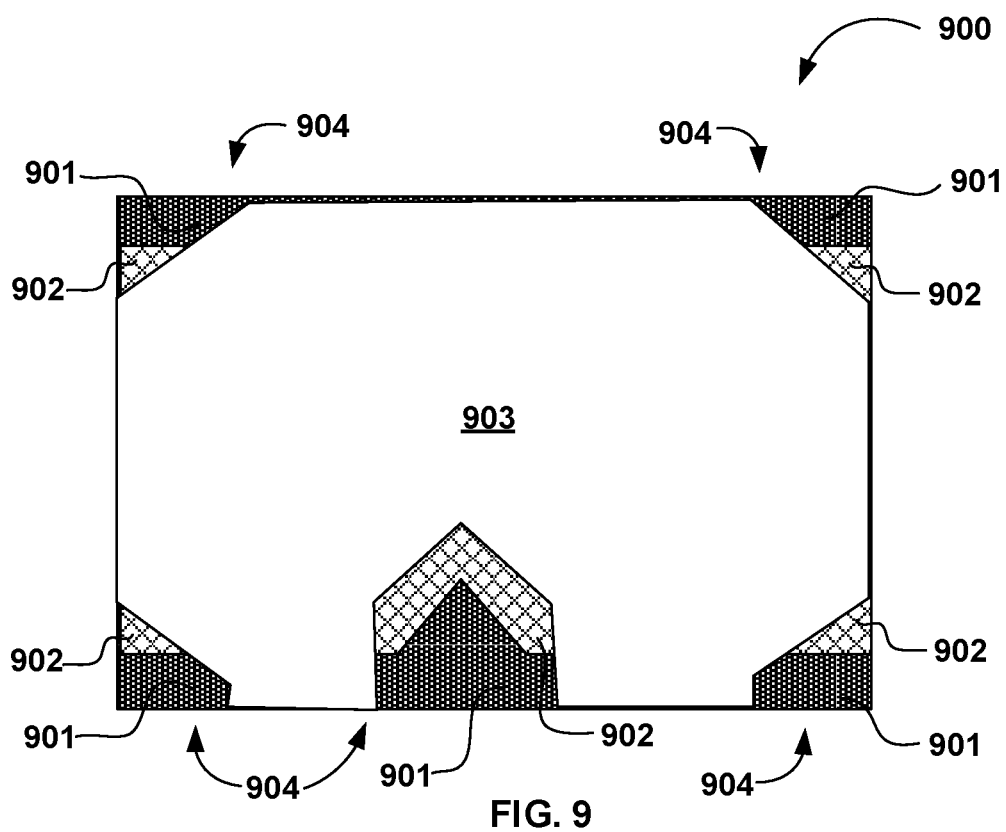
FIG. 9 illustrates a plan view of a MIS package substrate unit having a partial protective frame comprising extensions for reinforcement of localized regions of MIS package substrate unit 900, according to some embodiments of the disclosure.

FIG. 9 illustrates a plan view of MIS package substrate unit 900 having a partial protective frame comprising extensions for reinforcement of localized regions of MIS package substrate unit 900, according to some embodiments of the disclosure.

In FIG. 9, MIS package substrate unit 900 comprises localized protective sections 904 of bumper zone 901 and mesh zone 902 distributed along the perimeter of dielectric zone 903. In the illustrated embodiment, localized areas of dielectric zone 903 in the vicinity of localized protective sections 904 that have greater vulnerability than other areas of dielectric zone 903.

Figure 10:
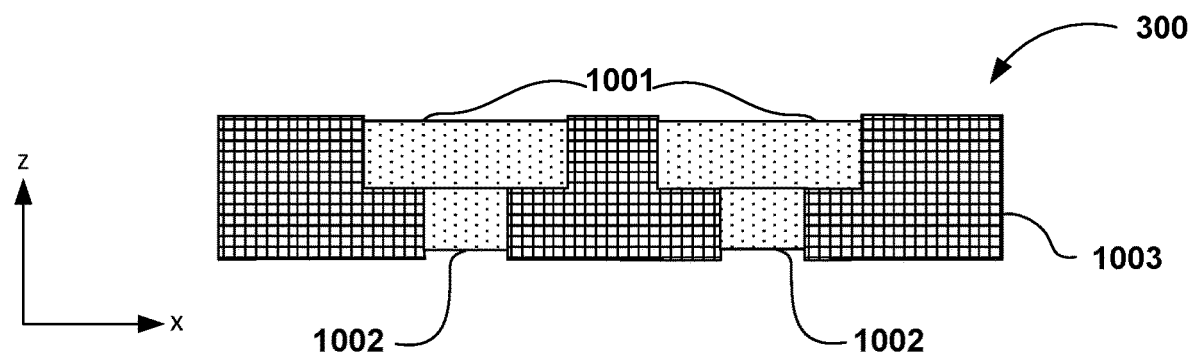
FIG. 10 illustrates a cross-sectional view of a MIS package substrate panel having a single layer and single protective frame, according to some embodiments of this disclosure.

FIG. 10 illustrates a cross-sectional view of MIS package substrate panel 300 having a single layer and single protective frame, according to some embodiments of this disclosure.

In the cross-sectional view of FIG. 10, details of the metallization structures are shown for MIS package substrate panel 300. In some embodiments, metallization structures 1001 are embedded in dielectric 1003. In some embodiments, metallization structures 1001 are planar with a first surface of dielectric 1003. In some embodiments, metallization structures 1001 are struts, such as struts 401 in FIG. 4 (within mesh zone 302, FIG. 3). In some embodiments, metallization structures 1001 are bond pads within individual package substrate units 303 in FIGS. 3 and 4. Pillars 1002 extend from metallization structures 1001 to an opposing second surface of dielectric 1003. In some embodiments, pillars 1002 are planar with the second surface of dielectric 1003. In some embodiments, metallization structures 1001 are recessed from the first surface of dielectric 301. In some embodiments, pillars 1002 are recessed from the second surface of dielectric 301. Metallization structures 1001 and pillars 1002 comprise a metal such as, copper, copper alloys, nickel, nickel alloys, or gold.

Figure 11:
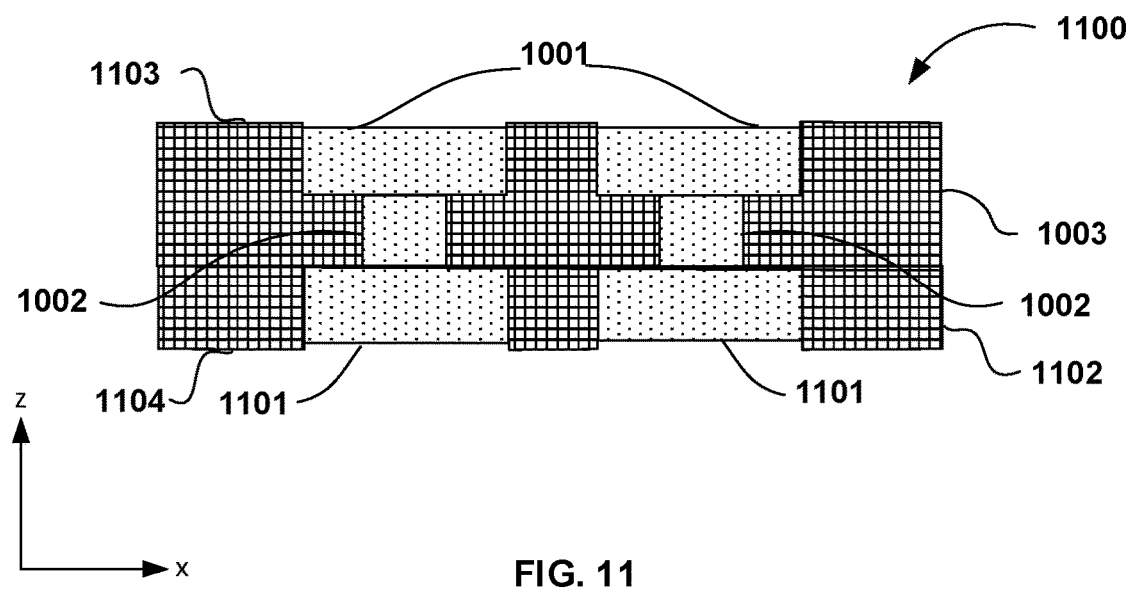
FIG. 11 illustrates a cross-sectional view of a MIS package substrate panel having a two layer and a double layer protective frame, according to some embodiments of this disclosure.

FIG. 11 illustrates a cross-sectional view of MIS package substrate panel 1100 having a two layers and a double layer protective frame, according to some embodiments of this disclosure.

In FIG. 11, a second layer of metallization, comprising metallization structure 1101, is included in MIS package substrate panel 1100, comprising a second dielectric 1102. In some embodiments, dielectric 1003 is a first dielectric layer extend between first surface 1103 and second dielectric 1102. In some embodiments, dielectric 1102 is a second dielectric layer over dielectric 1003, extending between dielectric 1003 and second surface 1104. In some embodiments, metallization structures 1101 are embedded in second dielectric 1102 and planar with second surface 1104. In some embodiments, metallization structures 1101 are struts in a second protective frame that extends along the perimeter of dielectric 1102 of MIS package substrate panel 1100.

In some embodiments, metallization structures 1001 are parts of a first protective frame extending along the edges of first surface 1103 of MIS package substrate panel 1100, and metallization structures 1101 are parts of a second protective frame extending along the edges of second surface 1104 of MIS package substrate panel 1100. In some embodiments, metallization structures 1001 are interconnected to metallization structures 1101 by pillars 1002. In some embodiments, pillars 1002 are vias interconnecting metallization structures 1001 and metallization structures 1101.

FIGS. 12A-12E illustrate plan views, respectively, of the mitigation of crack propagation in a MIS package substrate panel having a protective frame, according to some embodiments of this disclosure.

Figure 12A:
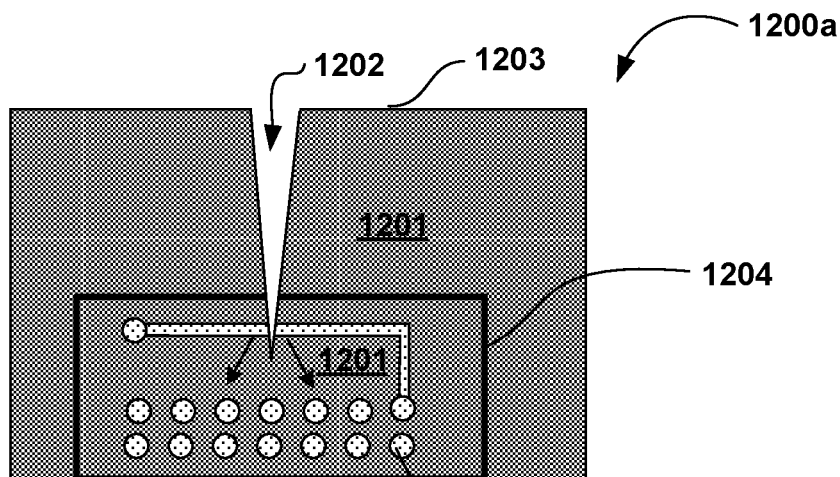
FIGS. 12A-12E illustrate plan views of the mitigation of crack propagation in a MIS package substrate panel having a protective frame, according to some embodiments of this disclosure.

FIG. 12A shows an edge region of an unprotected MIS package substrate panel 700a comprising dielectric 1201, which lacks a protective frame as described above. Crack 1202 propagates inwardly from edge 1203 of MIS package substrate panel 1200a, indicated by the downward-pointing arrows. In some embodiments, dielectric 1201 comprises a brittle moldable material such as, but not limited to, an epoxy resin or a ceramic composite. In some embodiments, dielectric 1201 has a fracture toughness less than 5 MPa-s$^{1/2}$.

In some embodiments, individual package substrate unit 1204 comprises dielectric 501 and metallization structures 1205. In the illustrated example, package substrate unit 504 is shown to be breached by crack 1202, damaging metallization structures 1205 and dielectric 1201.

Figure 12B:
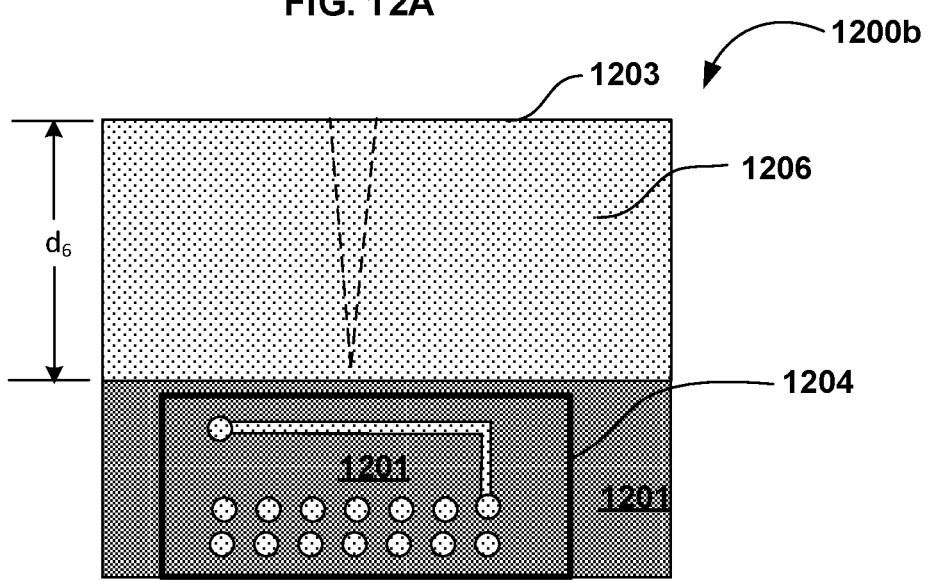

In FIG. 12B, MIS package substrate panel 1200b comprises bumper zone 1206, extending inwardly from edge 1203 a distance $d_6$. Dielectric 1201 occupies the interior region of MIS package substrate panel 1200b, and abuts bumper zone 1210. In the illustrated embodiment of FIG. 12B, bumper zone 1206 has sufficient width $d_6$ to prevent cracks (indicated by the dashed outline) from propagating into dielectric 1201, as explained below. Package substrate unit 1204, adjacent to bumper zone 1210, is protected as a result.

In some embodiments, width $d_6$ of bumper zone 1206 is sufficient to receive clamping pads from processing tools without overlapping dielectric 1201. In some embodiments, bumper zone 1206 comprises a material having a fracture toughness larger than dielectric 1201. In some embodiments, bumper zone 1206 has a fracture toughness greater than 15 MPa-s$^{1/2}$. In some embodiments, bumper zone 1206 comprises a metal, such as, but not limited to, copper, alloys of copper, nickel or gold. In some embodiments, bumper zone 1206 comprises a polymer. Bumper zone 1206 may absorb most or substantially all of the clamping forces that otherwise could form cracks in dielectric 1201.

Figure 12C:
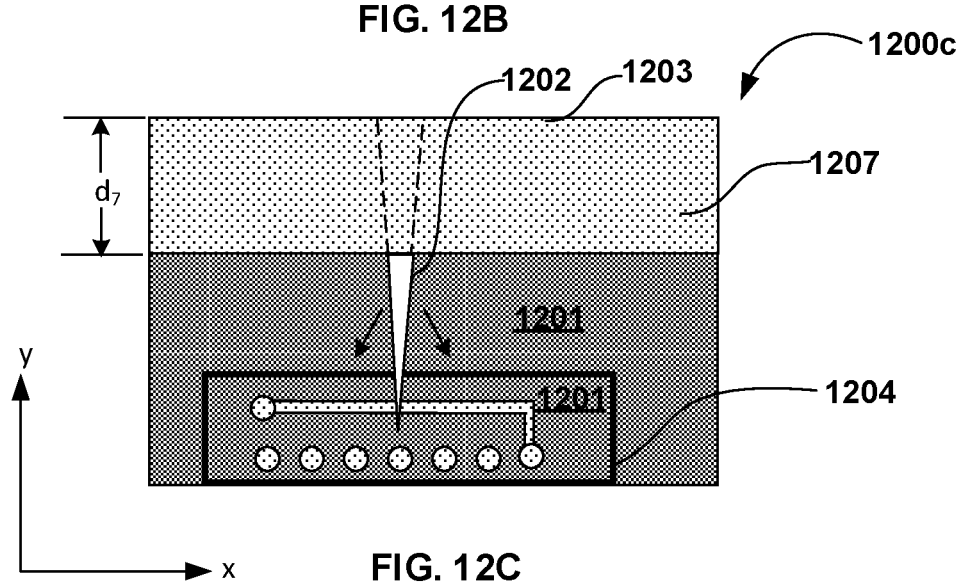

An alternative example is illustrated in FIG. 12C, where MIS package substrate panel 500c comprises bumper zone 1207, extending inwardly a distance $d_7$ from edge 1203, abutting dielectric 1201. In the illustrated embodiment of FIG. 12C, distance $d_7$ is less than distance $d_6$, and is not sufficient to cover the footprint of clamping pads from processing tools. Clamping pads may grasp bumper zone 1207, however overlap adjacent regions of dielectric 1201. In this example, clamping forces are directly applied to dielectric 1201, causing crack formation. Crack 1202 propagates inwardly from the edge of bumper zone 1207 as indicated by the down-pointing arrows, and breaches package substrate unit 1204.

Figure 12D:
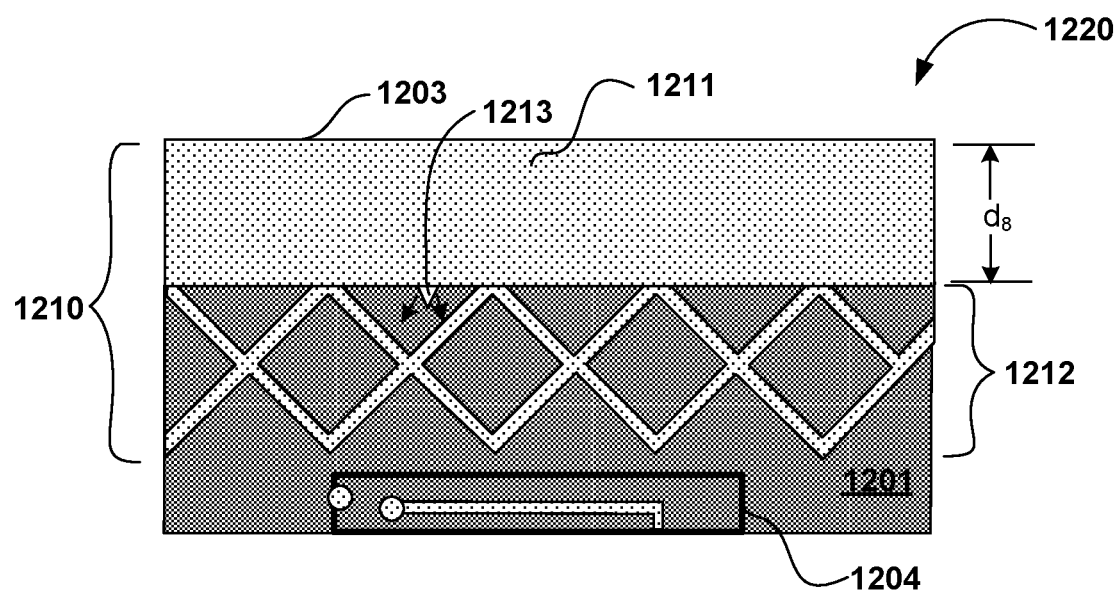

In FIG. 12D, MIS package substrate panel 1220 comprises frame structure 1210, comprising bumper zone 1211, mesh zone 1212 and package substrate unit 1204. In the illustrated example in FIG. 12D, bumper zone 1211 extends inwardly a distance $d_8$ from edge 1203, abutting mesh zone 1212. In the illustrated embodiment of FIG. 12D, distance $d_8$ is less than distance $d_6$, and is not sufficient to cover the footprint of clamping pads from processing tools. Clamping pads may grasp mesh zone 1212, and clamping forces may cause crack 1213 to develop in dielectric 501 within the voids. In the illustrated example, crack 1213 is shown in an incipient stage, extending from the inner edge of bumper zone 1211 into the dielectric (1201) in an adjacent void, and propagating further into the void (shown by down-pointing arrows).

Figure 12E:
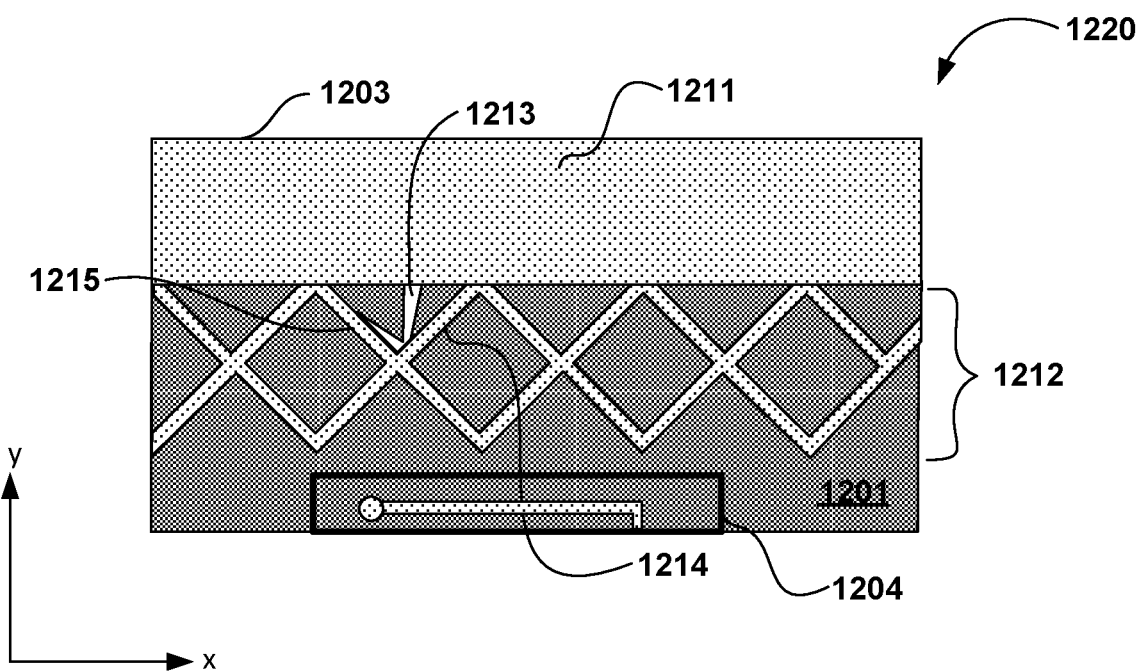

In FIG. 12E, MIS package substrate panel 1220 comprises bumper zone 1211 and mesh zone 1212, as described above. Crack 1213 has propagated from the edge of bumper zone 1211 in dielectric 1201 enclosed by strut 1214 and strut 1215. In the illustrated embodiment, crack 1213 has propagated to strut 1214, which has deflected crack 1213 along strut 1215. In this implementation, mesh zone 1212 presents a barrier to crack propagation. In some embodiments, crack 1213 may extend beyond strut 1214 into an adjacent void. In some embodiments, multiple cracks may occur. The degree of crack formation is dependent on the stresses imposed on MIS package substrate panel 1220. Mesh zone 1212 prevents cracks originating near edge 1203 from propagating into dielectric 1201 in the inner region of MIS package substrate panel 1220. Mesh zone 1212 saves package substrate unit 1204 from impingement by crack 1213.

FIGS. 13A-13H illustrate cross-sectional views, respectively, of a method for formation of MIS package substrate panel 300 having a single mesh layer, according to some embodiments of this disclosure.

Figure 13A:
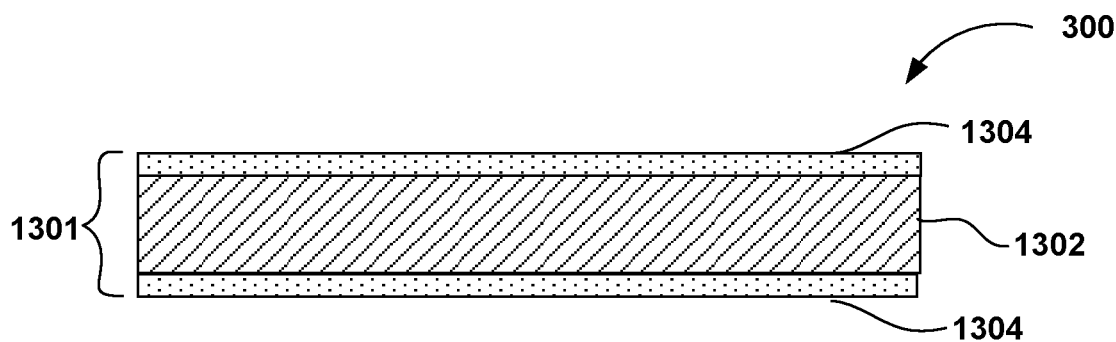
FIGS. 13A-13H illustrate cross-sectional views of a method for formation of a MIS package substrate panel having a single mesh layer protective frame, according to some embodiments of this disclosure.

In the operation shown in FIG. 13A, carrier 1301 is received. In some embodiments, carrier 1301 comprises dielectric core 1302, having copper cladding layers 1303 and 1304 on opposing sides of dielectric core 1302. In some embodiments, carrier 1301 is a printed circuit board. Carrier 1301 has x-y dimensions that equal or exceed predetermined dimensions for MIS package substrate panel 300.

Figure 13B:
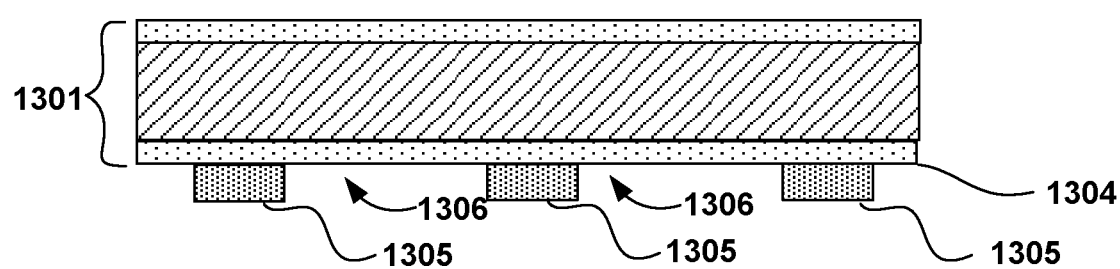

In the operation shown in FIG. 13B, first photoresist 1305 is laminated over one copper cladding layer 1304 of carrier 1301. In some embodiments, first photoresist 1305 is a dry film resist. In some embodiments, photoresist 1305 is applied by spin coating. In some embodiments, first photoresist 1305 is applied by spray coating. In the illustrated embodiment, openings 1306 are patterned into first photoresist 1305. Openings 1306 expose areas of underlying copper layer 1304 as cathodes for electroplating metals, such as copper, into openings 1306.

Figure 13C:
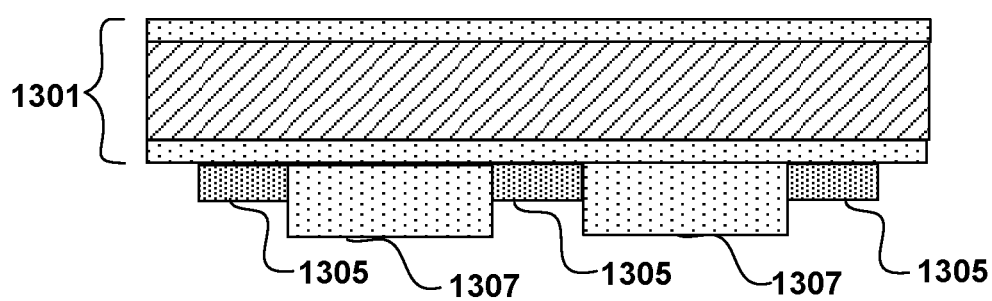

In the operation shown in FIG. 13C, metallization structures 1307 are electroformed (e.g., electroplated) into former openings 1306 in first photoresist 1305. In some embodiments, metallization structures 1307 are bond pads. In some embodiments, metallization structures 1307 are platforms for a second layer of metallization structures that are to be plated in a subsequent operation. In some embodiments, metallization structures 1307 are formed by electrodeposition of a metal comprising copper. In some embodiments, metallization structures 1307 are formed by electrodeposition of a metal comprising nickel. In some embodiments, metallization structures 1307 are bond pads of a first conductive layer of MIS package substrate 300.

Figure 13D:
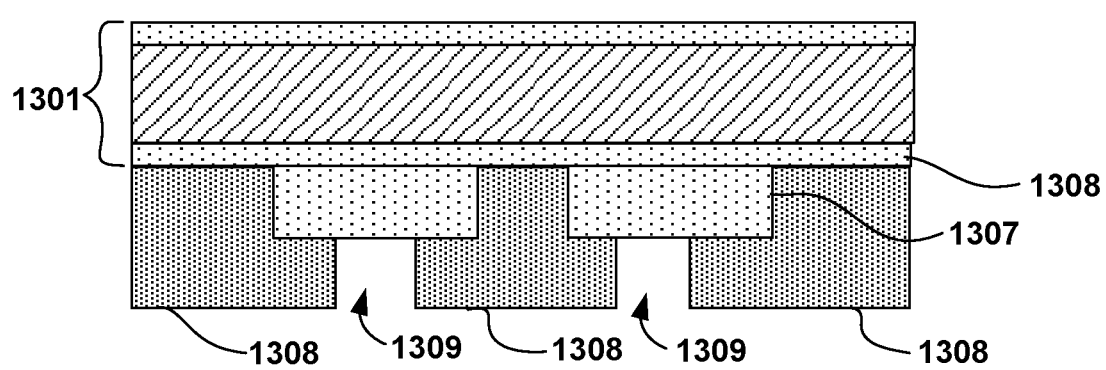

In the operation shown in FIG. 13D, first photoresist layer 1305 has been stripped in a previous operation. Second photoresist 1308 is added over metallization structures 1307 and copper cladding 1304 on carrier 1301. In some embodiments, second photoresist 1308 is a laminated dry film resist. In some embodiments, second photoresist 1308 is a spun-on liquid resist. In some embodiments, second photoresist 1308 is a sprayed-on liquid resist. In the illustrated embodiment, openings 1309 have been patterned into second photoresist 1308 in a previous operation. In some embodiments, openings 1309 form molds for electrodeposited pillars, to be formed in a subsequent step. In some embodiments, second photoresist 1308 is thicker than first photoresist 1305 to adjust pillar z-height.

Figure 13E:
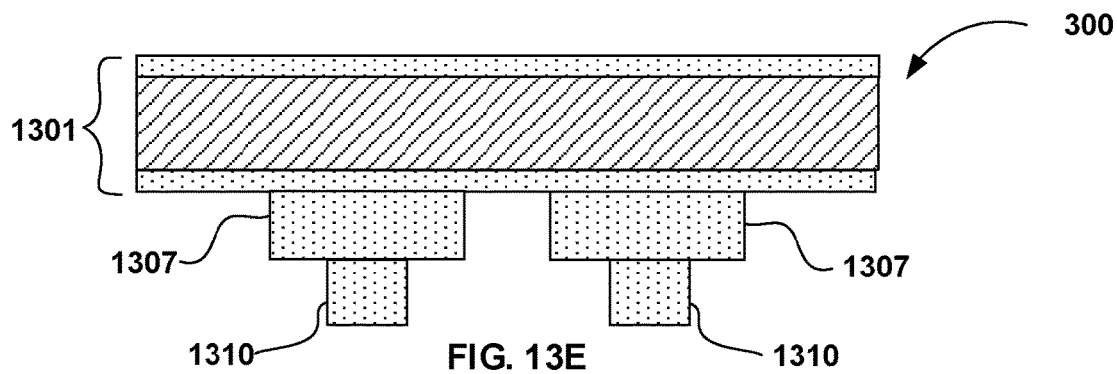

In the operation shown in FIG. 13E, second photoresist 1308 has been removed in a previous operation. In some embodiments, standard photoresist strip methods are employed. Pillars 1310 have been electroplated into former openings 1309 over metallization structures 1307. In some embodiments, metallization structures 1307 are first metallization structures, and pillars 1310 are second metallization structures. Pillars 1310 comprise a metal such as, but not limited to, copper, alloys of copper, nickel or gold. In some embodiments, pillars 1310 form vias to interconnect a second conductive layer (to be formed in a subsequent operation) to the first conductive layer, which comprises first metallization structures 1307.

Figure 13F:
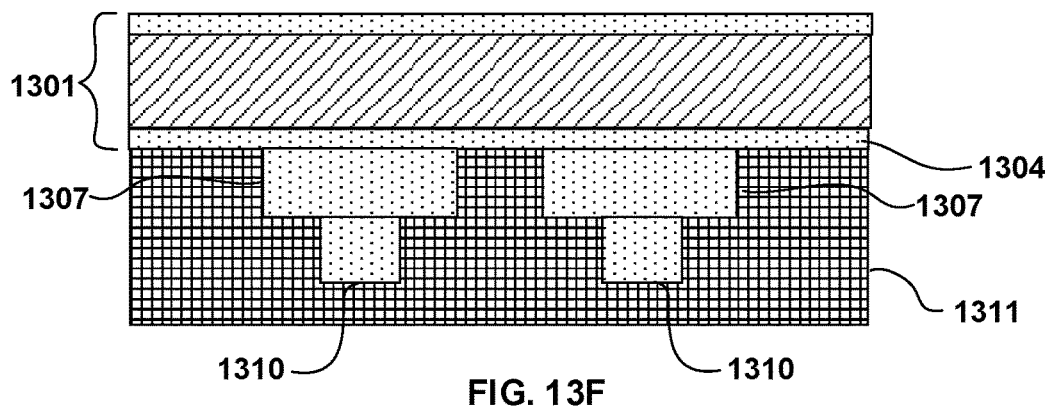

In the operation shown in FIG. 13F, dielectric layer 1311 is molded over pillars 1310, first metallization structures 1307, and copper cladding layer 1304 on carrier 1301. In some embodiments, dielectric layer 1311 comprises an epoxy resin. In some molding operation embodiments, dielectric layer 1311 is flowed in an uncured molten state at high temperatures over metallization structures, such as pillars 1310 and first metallization structures 1307. Dielectric layer 1311 is molded on copper cladding layer 1304, and supported on carrier 1301. In some molding operation embodiments, dielectric layer 1311 is flowed in a liquid state at room temperature. In some embodiments, dielectric layer 1311 has a z-height that exceeds the z-height of pillars 1310. In some molding operation embodiments, dielectric layer 1311 undergoes a curing step at temperatures up to 160° C.

Figure 13G:
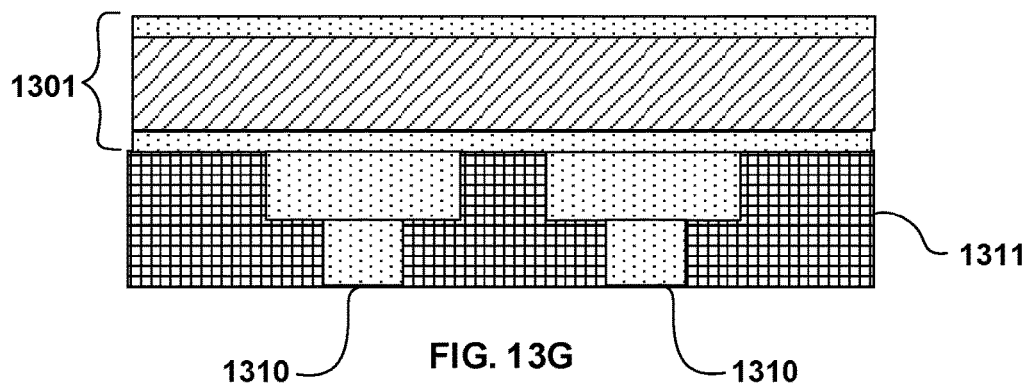

In the operation shown in FIG. 13G, dielectric layer 1311 is planarized to reveal tops of pillars 1310. In some embodiments, dielectric layer 1311 is planarized by chemomechanical polishing. In some embodiments, dielectric layer 1311 is subject to a plasma etch, such as, but not limited to, oxygen etch or a deep reactive ion etch (DRIE). In some embodiments, the thickness of dielectric layer 1311 is adjusted by the planarization operation. In some embodiments, dielectric layer 1311 has a thickness ranging between 50 microns and 500 microns.

Figure 13H:
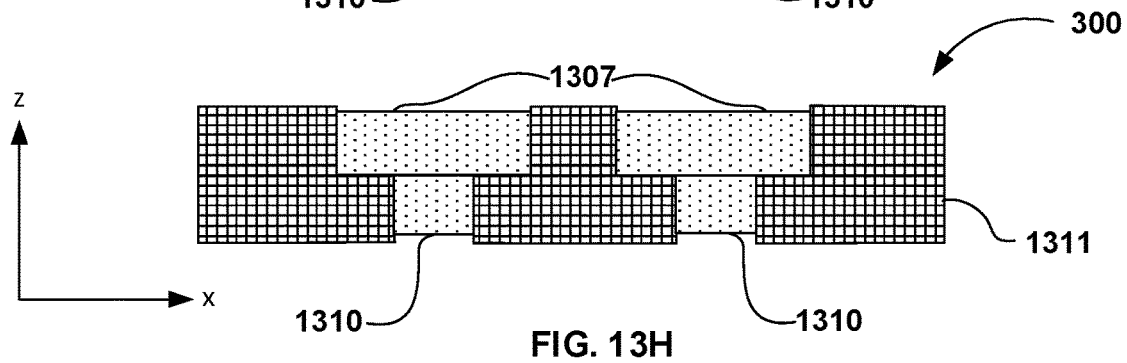

In the operation shown in FIG. 13H, MIS package substrate 300 is separated from carrier 601. In some embodiments, dielectric layer 1311 is delaminated by temperature cycling. A large thermal expansion coefficient (CTE) differential may exist between dielectric layer 1311 and carrier 1301 (not shown in FIG. 13H), allowing a heating cycle or freezing cycle to delaminate MIS package substrate panel from carrier 1301. After delamination of dielectric layer 1311, first metallization structures 1307 and tops of pillars 1310 are slightly recessed by a flash etch.

FIGS. 14A-14F illustrate cross-sectional views, respectively, of a process flow for an exemplary method for the formation of MIS package substrate panel 600 having a single double mesh layer, according to some embodiments of this disclosure.

Figure 14A:
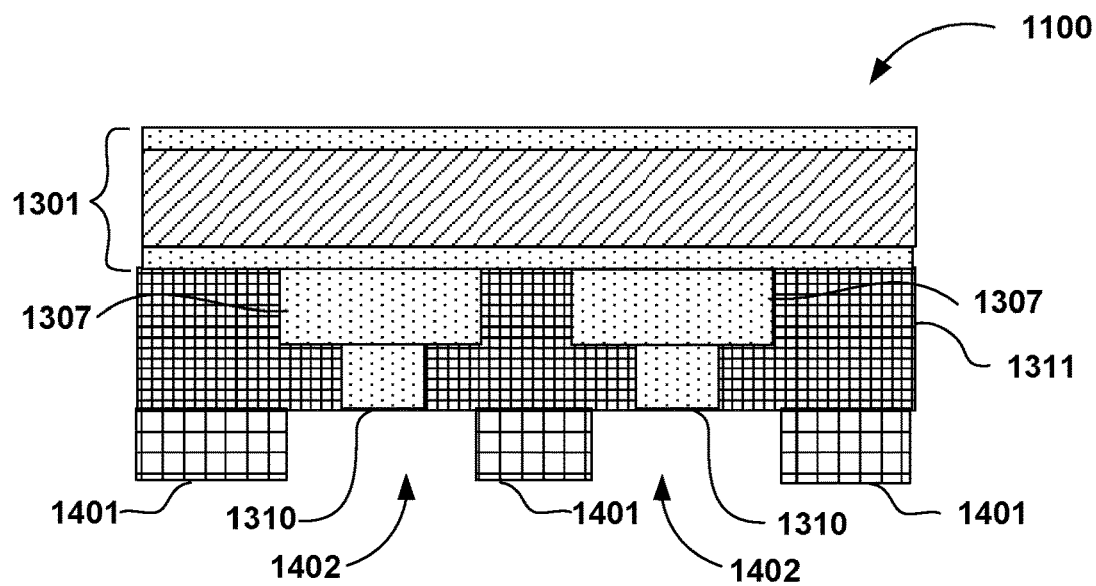
FIGS. 14A-14F illustrate cross-sectional views of a process flow for an exemplary method for the formation of a MIS package substrate panel having a double mesh layer protective frame, according to some embodiments of this disclosure.

In the operation illustrated in FIG. 14A, MIS package substrate panel 1100 is received at the process level shown in FIG. 13G. In the illustrated embodiment, MIS package substrate panel 300 as received is mounted on carrier 1301, and comprises dielectric layer 1311, first metallization structures 1307, and pillars 1310. In the illustrated embodiment, MIS package substrate panel 1100 is further processed by formation of third photoresist 1401 over first dielectric layer 1311. Third photoresist 1401 has been lithographically patterned in previous operations (not shown) to create openings over pillars 1310. In some embodiments, tops of pillars 1310 are exposed. In some embodiments, openings 1402 are created by laser skiving. In some embodiments, openings 1402 are created by an etch operation. In some embodiments, third photoresist 1401 is subjected to a plasma etch, such as an oxygen plasma. In some embodiments, a wet chemical etch is employed to create openings 1402. In some embodiments, the tops of pillars 1311 are revealed by openings 1402. In some embodiments, third photoresist 1401 is lithographically patterned to form openings 1402 with predetermined dimensions. In some embodiments, third photoresist 1401 has a thickness ranging between 1 and 20 microns.

Figure 14B:
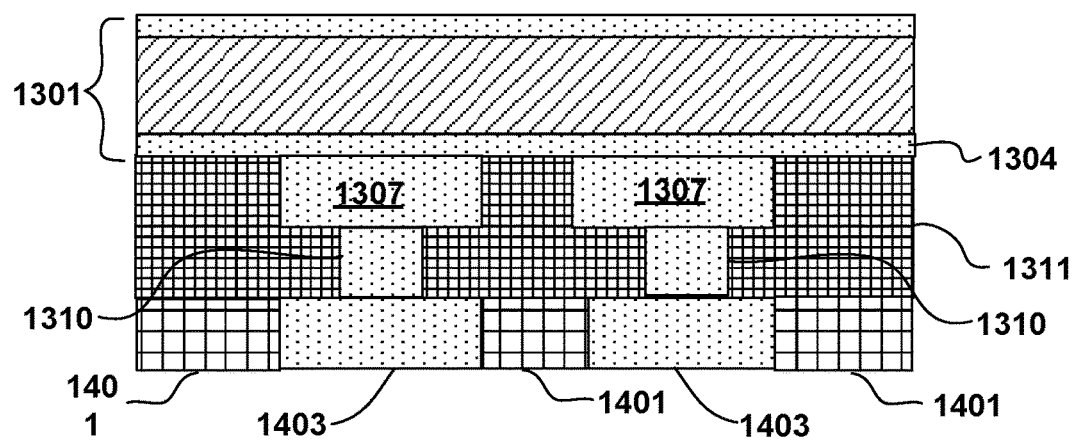

In the operation shown in FIG. 14B, second metallization structures 1403 are formed by electrodeposition of a suitable metal into former openings 1402. In some embodiments, the metal is copper. In some embodiments, the metal is an alloy of copper. In some embodiments, the metal is nickel. In some embodiments, the metal is an alloy of nickel. In some embodiments, the metal is gold or an alloy of gold. In some embodiments, electrodeposition is facilitated by a potentiostat electrically coupled to cladding layer 1304 on carrier 1301. Cladding layer 1304 is coupled to pillars 1310 through first metallization structures 1307. In some embodiments, the tops of pillars 1310 function as cathodes (e.g., negative electrodes) for the electrodeposition process. In some embodiments, second metallization structures 1403 have predetermined dimensions according to lithographically defined openings 1402 formed previously (FIG. 14A).

In some embodiments, second metallization structures 1403 are mesh struts of a second mesh zone of a dual layer protective frame, disposed along the perimeter of MIS package substrate panel 1100. In some embodiments, pillars 1310 are vias forming mechanical interconnects between first metallization structures 1307 and second metallization structures 1403. In some embodiments, first metallization structures 1307 are mesh struts of the first mesh zone of the dual layer protective frame, (e.g., 401 in FIG. 4; struts 1214 and 1215 in FIG. 12D) in mesh zone 1212 in the plan view in FIGS. 12D and 12E. In some embodiments, second metallization structures are bond pads or traces in a second conductive layer of individual MIS package substrate units carried in MIS package substrate panel 1100. In some embodiments, first metallization structures 1307 are bond pads or traces in a first conductive layer of individual MIS package substrate units, interconnected to the second conductive layer (second metallization structures 1403) by vias formed by pillars 1310.

Figure 14C:
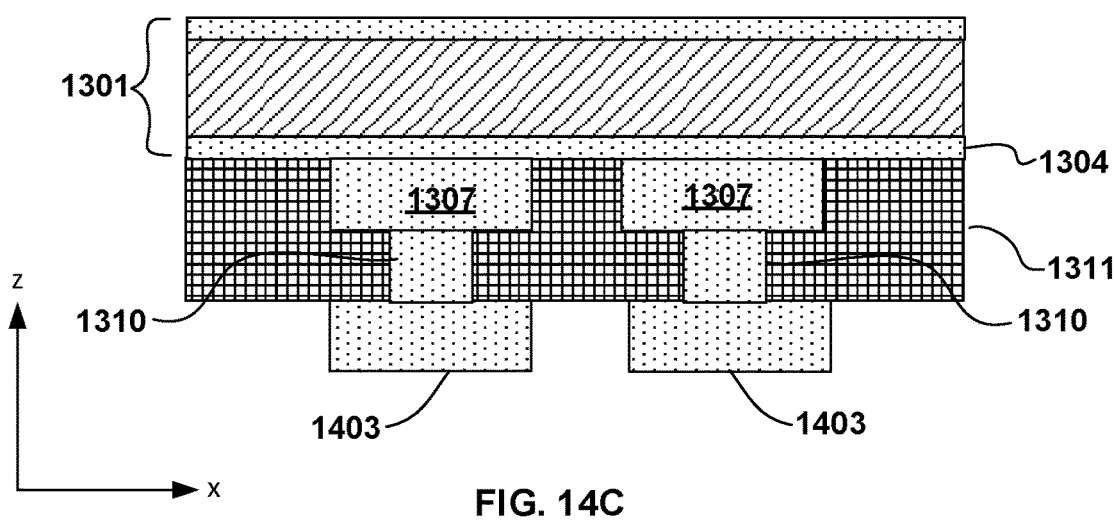

In the operation shown in FIG. 14C, third photoresist 1401 is removed, revealing dielectric layer 1311 and second metallization structures 1403. In some embodiments, third photoresist 1401 is stripped by wet chemical dissolution, where dielectric layer 1311 is substantially resistant to attack by the stripping bath.

Figure 14D:
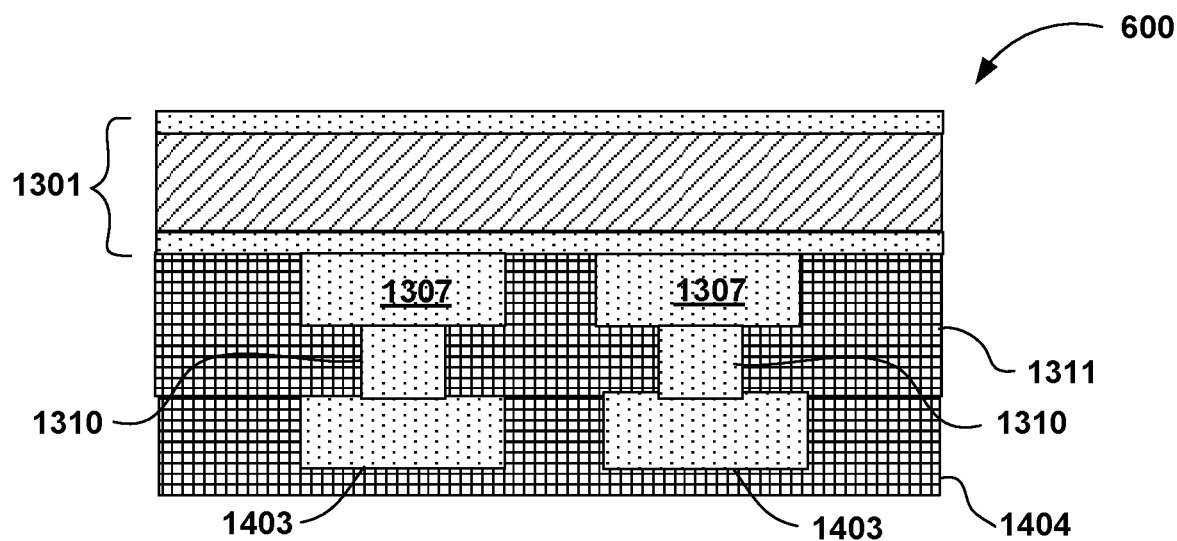

In the operation shown in FIG. 14D, MIS package substrate panel 1100 is supported on carrier 1301. A second dielectric layer (1404) is formed over dielectric layer 1311. In some embodiments, dielectric layer 1311 is a first dielectric layer, and second dielectric layer 1404 is formed over first dielectric layer 1311 and second metallization structures 1403. In some embodiments, second dielectric layer 1404 comprises a moldable epoxy resin. In some embodiments, second dielectric layer 1404 is molded over first dielectric layer 1311 and second metallization structures 1403. In some embodiments, second dielectric layer 1404 is formed according to the exemplary dielectric molding process described for FIG. 13F. In some embodiments, second dielectric layer 1404 comprises the same material as first dielectric layer 1311. In some embodiments, second dielectric layer 1404 comprises a dielectric material that is different than that comprised by dielectric layer 1311. In some embodiments, second dielectric layer 1404 has a thickness that is at least the z-height of second metallization structures 1403.

In some embodiments, second dielectric layer 1404 functions to embed second metallization structures 1403. In some embodiments, second metallization structures 1403 are mesh zone struts, similar the struts (e.g., 401 in FIG. 4; struts 1214 and 1215 in FIG. 12D) in mesh zone 1212 in the plan view in FIGS. 12D and 12E. Second metallization structures function as mesh struts are embedded in the dielectric (e.g., combined first dielectric layer 1311 and second dielectric layer 1404), in order to efficiently intercept cracks forming in the dielectric of MIS package substrate panel 1100, according to some embodiments (refer to description of FIGS. 3 and 4).

Figure 14E:
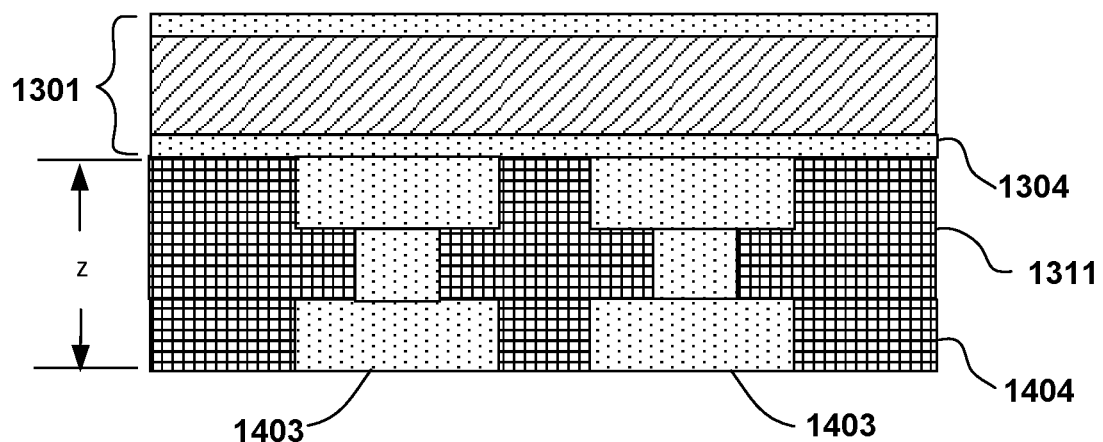

In the operation shown in FIG. 14E, second dielectric layer 1404 is planarized to reveal the tops of second metallization structures 1403. In some embodiments, planarization is performed by chemomechanical polishing (CMP). In some embodiments, planarization of second dielectric layer 1404 is performed by a plasma etch, such as deep reactive ion etching (DRIE). In some embodiments, planarization of second dielectric layer 1404 is performed by RF sputtering, of the top surface of second dielectric layer 1404. In some embodiments, planarization of second dielectric layer 1404 is performed by a wet chemical etch. The level of planarization is predetermined to reveal the tops of second metallization structures 1403. In some embodiments, the dielectric layer comprising first dielectric layer 1311 and second dielectric layer 1404 has a thickness that is substantially the same as the distance z between cladding layer 1303 on carrier 1301, and second metallization layer 1403.

Figure 14F:
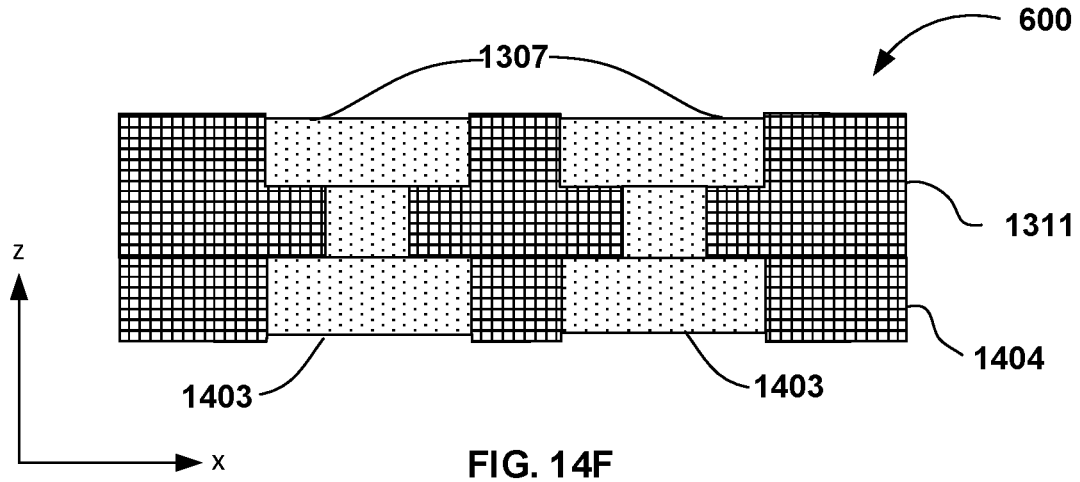

In the operation shown in FIG. 14F, MIS package substrate panel 1100 is separated from carrier 1301. In some embodiments, dielectric layer 1311 is delaminated by temperature cycling. A large thermal expansion coefficient (CTE) differential may exist between dielectric layer 1311 and carrier 1301 (not shown in FIG. 14F), allowing a heating cycle or freezing cycle to delaminate MIS package substrate panel from carrier 1301. After delamination of dielectric layer 1311. In some embodiments, first metallization structures 1307 and second metallization structures 1403 are slightly recessed by a flash etch.

Figure 15:
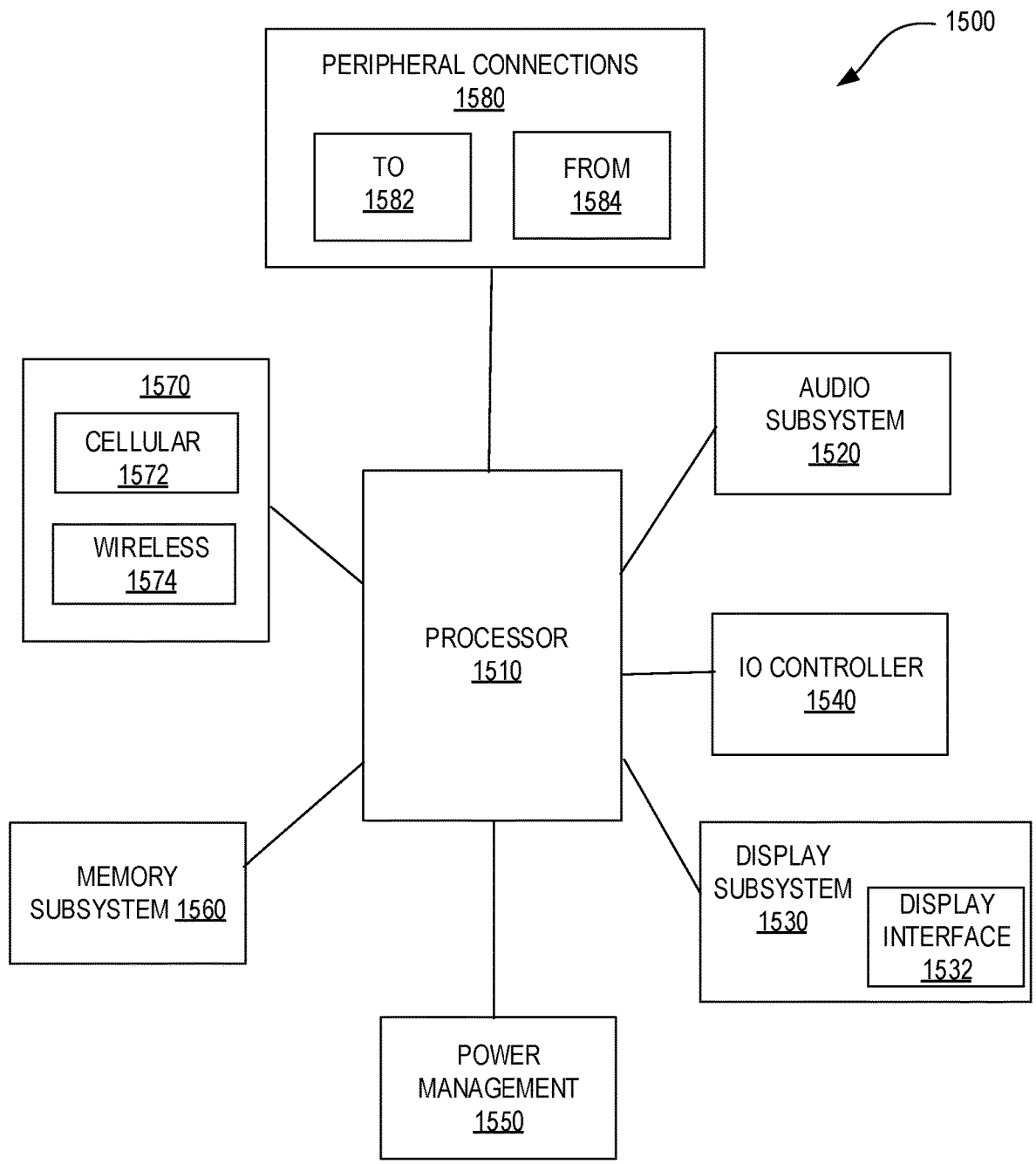
FIG. 15 illustrates a MIS package having a substrate comprising a protective frame as part of a system-on-chip (SoC) package in an implementation of computing device, according to some embodiments of the disclosure.

FIG. 15 illustrates a MIS package having a substrate comprising a protective frame as part of a system-on-chip (SoC) package in an implementation of computing device, according to some embodiments of the disclosure.

FIG. 15 illustrates a block diagram of an embodiment of a mobile device in which flat surface interface connectors could be used. In some embodiments, computing device 1500 represents a mobile computing device, such as a computing tablet, a mobile phone or smart-phone, a wireless-enabled e-reader, or other wireless mobile device. It will be understood that certain components are shown generally, and not all components of such a device are shown in computing device 1500.

In some embodiments, computing device 1500 includes a first processor 1510. The various embodiments of the present disclosure may also comprise a network interface within 1570 such as a wireless interface so that a system embodiment may be incorporated into a wireless device, for example, cell phone or personal digital assistant.

In one embodiment, processor 1510 can include one or more physical devices, such as microprocessors, application processors, microcontrollers, programmable logic devices, or other processing means. The processing operations performed by processor 1510 include the execution of an operating platform or operating system on which applications and/or device functions are executed. The processing operations include operations related to I/O (input/output) with a human user or with other devices, operations related to power management, and/or operations related to connecting the computing device 1500 to another device. The processing operations may also include operations related to audio I/O and/or display I/O.

In one embodiment, computing device 1500 includes audio subsystem 1520, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1500, or connected to the computing device 1500. In one embodiment, a user interacts with the computing device 1500 by providing audio commands that are received and processed by processor 1510.

Display subsystem 1530 represents hardware (e.g., display devices) and software (e.g., drivers) components that provide a visual and/or tactile display for a user to interact with the computing device 1500. Display subsystem 1530 includes display interface 1532 which includes the particular screen or hardware device used to provide a display to a user. In one embodiment, display interface 1532 includes logic separate from processor 1510 to perform at least some processing related to the display. In one embodiment, display subsystem 1530 includes a touch screen (or touch pad) device that provides both output and input to a user.

I/O controller 1540 represents hardware devices and software components related to interaction with a user. I/O controller 1540 is operable to manage hardware that is part of audio subsystem 1520 and/or display subsystem 1530. Additionally, I/O controller 1540 illustrates a connection point for additional devices that connect to computing device 1500 through which a user might interact with the system. For example, devices that can be attached to the computing device 1500 might include microphone devices, speaker or stereo systems, video systems or other display devices, keyboard or keypad devices, or other I/O devices for use with specific applications such as card readers or other devices.

As mentioned above, I/O controller 1540 can interact with audio subsystem 1520 and/or display subsystem 1530. For example, input through a microphone or other audio device can provide input or commands for one or more applications or functions of the computing device 1500. Additionally, audio output can be provided instead of, or in addition to display output. In another example, if display subsystem 1530 includes a touch screen, the display device also acts as an input device, which can be at least partially managed by I/O controller 1540. There can also be additional buttons or switches on the computing device 1500 to provide I/O functions managed by I/O controller 1540.

In one embodiment, I/O controller 1540 manages devices such as accelerometers, cameras, light sensors or other environmental sensors, or other hardware that can be included in the computing device 1500. The input can be part of direct user interaction, as well as providing environmental input to the system to influence its operations (such as filtering for noise, adjusting displays for brightness detection, applying a flash for a camera, or other features).

In one embodiment, computing device 1500 includes power management 1550 that manages battery power usage, charging of the battery, and features related to power saving operation. Memory subsystem 1560 includes memory devices for storing information in computing device 1500. Memory can include nonvolatile (state does not change if power to the memory device is interrupted) and/or volatile (state is indeterminate if power to the memory device is interrupted) memory devices. Memory subsystem 1560 can store application data, user data, music, photos, documents, or other data, as well as system data (whether long-term or temporary) related to the execution of the applications and functions of the computing device 1500.

Elements of embodiments are also provided as a machine-readable medium (e.g., memory 1560) for storing the computer-executable instructions. The machine-readable medium (e.g., memory 1560) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 1570 includes hardware devices (e.g., wireless and/or wired connectors and communication hardware) and software components (e.g., drivers, protocol stacks) to enable the computing device 1500 to communicate with external devices. The computing device 1500 could be separate devices, such as other computing devices, wireless access points or base stations, as well as peripherals such as headsets, printers, or other devices.

Network interface 1570 can include multiple different types of connectivity. To generalize, the computing device 1500 is illustrated with cellular connectivity 1572 and wireless connectivity 1574. Cellular connectivity 1572 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1574 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1580 include hardware interfaces and connectors, as well as software components (e.g., drivers, protocol stacks) to make peripheral connections. It will be understood that the computing device 1500 could both be a peripheral device ("to" 1582) to other computing devices, as well as have peripheral devices ("from" 1584) connected to it. The computing device 1500 commonly has a "docking" connector to connect to other computing devices for purposes such as managing (e.g., downloading and/or uploading, changing, synchronizing) content on computing device 1500. Additionally, a docking connector can allow computing device 1500 to connect to certain peripherals that allow the computing device 1500 to control content output, for example, to audiovisual or other systems.

In addition to a proprietary docking connector or other proprietary connection hardware, the computing device 1500 can make peripheral connections 1580 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising an IC package comprising a dielectric, the IC package having a first length, a second length, the first length and the second length are orthogonal, and a perimeter having sidewalls extending along the first length and the second length, and a structure comprising a frame that extends around the perimeter of the IC package, wherein the structure extends inwardly a distance from the sidewalls of the IC package, the distance is less than the smaller of the first length and the second length of the IC package.

Example 2 includes all of the features of example 1, wherein the distance is a first distance, and the structure comprises an outer portion extending a second distance inwardly from the sidewalls, the second distance is less than the first distance.

Example 3 includes all of the features of example 2, wherein the structure comprises an inner portion that comprises a mesh that extends inwardly from the outer portion of the structure for a third distance, and the first distance comprises the sum of the second distance and the third distance.

Example 4 includes all of the features of any one of the examples 1 through 3, wherein the structure comprises a material that has a larger fracture toughness than that of the dielectric.

Example 5 includes all of the features of example 4, wherein the material comprises one of copper, alloys of copper, nickel, alloys of nickel, gold or a polymer.

Example 6 includes all of the features of any one of the examples 3 through 5, wherein the inner portion comprises a network of intersecting struts comprising the material, and wherein one or more islands of the dielectric are interspersed within the inner portion.

Example 7 includes all of the features of example 6, wherein the perimeter of the one or more islands of the dielectric are bordered by the intersecting struts.

Example 8 includes all of the features of any one of claims 3 through 7, wherein the one or more assembly fiducials are within the inner portion of the frame.

Example 9 includes all of the features of any one of examples 1 through 8, wherein the IC package is a first IC package layer, the frame is a first frame, and wherein a second IC package layer is stacked over the first IC package layer, the second IC package layer comprises a dielectric, and a perimeter having sidewalls, wherein a second frame extends around the perimeter of the second IC package layer, wherein the second frame extends inwardly a distance from the sidewalls of the second IC package layer.

Example 10 includes all of the features of example 9, wherein the second frame comprises an outer portion and an inner portion that comprises a mesh, wherein the inner portion extends inwardly from the outer portion of the second frame.

Example 11 includes all of the features of any one or examples 9 or 10, wherein the second frame comprises a material that has a larger fracture toughness than that of the dielectric.

Example 12 includes all of the features of example 11, wherein the material comprises one of copper, alloys of copper, nickel, alloys of nickel, gold or a polymer.

Example 13 includes all of the features of any one of examples 9 through 12, wherein the inner portion of the second frame comprises a network of intersecting struts comprising the material, and wherein one or more islands of the dielectric are interspersed within the inner portion.

Example 14 includes all of the features of any one of examples 9 through 13, wherein the second frame further comprises one or more assembly fiducials.

Example 15 includes all of the features of example 14, wherein the one or more assembly fiducials are within the mesh portion of the second frame.

Example 16 includes all of the features of any one of examples 9 through 15, wherein the second frame is bonded to the first frame.

Example 17 includes all of the features of example 16, wherein the second frame is bonded to the first frame by one or more vias extending between the first frame and the second frame, and wherein the one or more vias are bonded to the first frame and to the second frame.

Example 18 includes all of the features of example 17, wherein the vias extend between the mesh portions of the first frame and the second frame.

Example 19 is an apparatus comprising a IC package panel comprising a perimeter, and one or more IC package units within the perimeter of the panel, the IC package units comprising a dielectric, and a structure comprising a frame that extends around the perimeter of the IC package panel, wherein the structure extends inwardly a distance from the sidewalls of the panel, and wherein the distance is less than the shortest length of the sidewalls.

Example 20 includes all of the features of example 19, wherein the distance is a first distance, and the structure comprises an outer portion extending a second distance inwardly from the sidewalls, the second distance is less than the first distance.

Example 21 includes all of the features of example 20, wherein the structure comprises an inner portion that comprises a mesh that extends inwardly from the outer portion of the structure for a third distance, and the first distance comprises the sum of the second distance and the third distance.

Example 22 includes all of the features of any one of examples 19 through 21, wherein the structure comprises a material that has a larger fracture toughness than that of the dielectric.

Example 23 includes all of the features of example 22, wherein the material comprises one of copper, alloys of copper, nickel, alloys of nickel, gold or a polymer.

Example 24 includes all of the features of any one of examples 21 through 23, wherein the structure further comprises one or more assembly fiducials.

Example 25 includes all of the features of example 24, wherein the one or more assembly fiducials are within the mesh portion of the frame.

Example 26 includes all of the features of any one of examples 19 through 25, wherein the one or more substrate units are arranged in a grid, and wherein the mesh portion of the frame extends between the one or more substrate units.

Example 27 includes all of the features of any one of examples 19 through 26, wherein the IC package panel is a first IC package panel layer, the frame is a first frame, and wherein a second IC package panel layer is stacked over the first IC package panel layer, the second IC package panel layer comprises a dielectric, and a perimeter having sidewalls, wherein a second frame extends around the perimeter of the second IC package panel layer, wherein the second frame extends inwardly a distance from the sidewalls of the second IC package panel layer.

Example 28 includes all of the features of any one of examples 19 through 27, wherein the inner portion of the second frame comprises a network of intersecting struts comprising the material, and wherein one or more islands of the dielectric are interspersed within the inner portion.

Example 29 includes all of the features of example 28, wherein the perimeter of the one or more islands of the dielectric are bordered by the intersecting struts.

Example 30 is a system comprising a memory and a processor coupled to the memory, the processor comprising an Integrated Circuit (IC) package comprising a dielectric, the IC package having a first length, a second length, the first length and the second length are orthogonal, and a perimeter having sidewalls extending along the first length and the second length; and a structure comprising a frame that extends around the perimeter of the IC package, wherein the structure extends inwardly a distance from the sidewalls of the IC package, the distance is less than the smaller of the first length and the second length of the IC package, wherein a wireless circuit is coupled to the processor for communication with an external device.

Example 31 includes all of the features of example 30, wherein the distance is a first distance, and the structure comprises an outer portion extending a second distance inwardly from the sidewalls, the second distance is less than the first distance.

Example 32 includes all of the features of any one of examples 30 or 31, wherein the structure comprises an inner portion that comprises a mesh that extends inwardly from the outer portion of the structure for a third distance, and the first distance comprises the sum of the second distance and the third distance.

Example 33 includes all of the features of any one of examples 30 through 32, wherein the structure comprises a material that has a larger fracture toughness than that of the dielectric.

Example 34 includes all of the features of example 33, the material comprises one of copper, alloys of copper, nickel, alloys of nickel, gold or a polymer.

Example 35 includes all of the features of any one of examples 32 through 34, wherein the inner portion comprises a network of intersecting struts comprising the material, and wherein one or more islands of the dielectric are interspersed within the inner portion.

Example 36 includes all of the features of example 35, wherein the perimeter of the one or more islands of the dielectric are bordered by the intersecting struts.

Example 37 includes all of the features of any one of examples 32 through 36, wherein the one or more assembly fiducials are within the inner portion of the frame.

Example 38 includes all of the features of any one of the examples 30 through 37, wherein the dielectric is interleaved between a first conductive level and a second conductive level, wherein the structure comprises a first plane within the first conductive level of the IC package stacked over a second plane within the second conductive level of the IC package, and wherein the first plane of the structure is coupled to the second plane of the structure by at least one interconnect that extends through the thickness of the dielectric.

Example 39 includes all of the features of any one of examples 30 through 38, wherein an IC die is coupled to the IC package.

Example 40 is a method, comprising receiving a carrier having conductive surfaces and a perimeter, depositing a photoresist over the carrier, forming a pattern in the photoresist to make a deposition mask, wherein the pattern formed in the deposition mask comprises metallization patterns for one or more package substrate units and for a frame feature along the perimeter of the carrier, and forming metallization structures on a surface of the carrier, wherein the metallization structures comprise a frame structure along the perimeter of the carrier.

Example 41 includes all of the features of example 40, wherein forming metallization structures on a surface of the carrier comprises forming metallization structures for one or more package substrate units. wherein the one or more package substrate units are arranged in a panel.

Example 42 includes all of the features of examples 40 or 41, wherein forming metallization structures on a surface of the carrier, comprises forming a frame structure along the perimeter of the carrier and mesh structures between the one or more package substrate units.

Example 43 includes all of the features of any one of examples 40 through 42, wherein the frame structure comprises an outer portion extending inwardly from the sidewalls.

Example 44 includes all of the features of any one of examples 40 through 43, wherein the frame structure further an inner portion comprising a mesh, the inner portion extends inwardly from the outer portion of the frame.

Example 45 includes all of the features of any one of examples 42 through 44, wherein forming mesh structures between the one or more package substrate units comprises forming mesh structures comprising a lattice of intersecting struts.

Example 46 includes all of the features of any one of examples 40 through 45, further comprising molding a first dielectric over the metallization structures, planarizing the dielectric to the level of the metallization structures, and removing the panel from the carrier.

Example 47 includes all of the features of any one of examples 40 through 46, wherein the photoresist is a first photoresist, the one or more package substrate units are the first layer of package substrate units, the metallization structures are first metallization structures.

Example 48 includes all of the features of example 47 further comprising depositing a second photoresist over the dielectric, forming a pattern in the second photoresist to make a deposition mask, wherein the pattern formed in the deposition mask comprises openings, forming one or more vias through the openings in the deposition mask, removing the deposition mask, molding a second dielectric over the one or more vias, and planarizing the dielectric to expose the tops of the one or more vias.

Example 49 includes all of the features of example 48, further comprising depositing a third photoresist over the dielectric, forming a pattern in the photoresist to make a deposition mask, wherein the pattern formed in the deposition mask comprises openings for the second layer of the one or more package substrate units, forming second metallization structures for the second layer of the one or more package substrate units through the deposition mask, wherein the second metallization structures are bonded to the vias, removing the deposition mask, molding a third dielectric over the second metallization structures for the second layer of the one or more package substrate units, and planarizing the dielectric.

Example 50 is an apparatus comprising a substrate comprising a dielectric, the substrate has a first surface and an opposing second surface, wherein the first surface is separated from the second surface by a thickness of the substrate, wherein sidewalls extend along a perimeter and through the thickness between the first surface and the second surface, a structure comprising a frame that extends at least partially along the perimeter of substrate, wherein the structure extends at least through the thickness of the substrate and inwardly from the sidewalls of the substrate, and an integrated circuit (IC) die coupled with the substrate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A method, comprising:
   receiving a carrier comprising first and second conductive surfaces separated by a core;
   depositing a photoresist over the carrier;
   forming a pattern in the photoresist to provide a deposition mask, wherein the pattern formed in the deposition mask comprises metallization patterns for one or more package substrate units and for a frame feature along a perimeter of the carrier;
   forming metallization structures over the first conductive surface of the carrier, wherein the metallization structures comprise a frame structure along the perimeter of the carrier and mesh structures between the package substrate units, and wherein the mesh structures comprise a lattice of intersection struts; and
   molding, after removal of the photoresist, a dielectric layer over the metallization structures, wherein the lattice of intersecting struts encloses islands of the dielectric layer.

2. The method of claim 1, further comprising:
   removing a portion of the dielectric layer to expose the metallization structures.

3. The method of claim 1, further comprising:
   forming second metallization structures over the metallization structures, wherein the frame structure and the mesh structures comprise the second metallization structures.

4. The method of claim 1, further comprising:
   removing the carrier from the package substrate units.

5. The method of claim 1, wherein the dielectric layer comprises a thickness, and the frame structure extends through the thickness of the dielectric layer.

6. The method of claim 1, wherein the metallization structures comprise one of copper, nickel, or gold.

7. A method, comprising:
   receiving a carrier comprising a core and a conductive surface over the core;
   patterning a plurality of openings in a resist layer over the conductive surface;
   forming metallization structures in the openings; and
   forming, after removal of the resist layer, a dielectric layer over the conductive surface and adjacent the metallization structures, wherein surfaces of the metallization structures opposite the conductive surface are exposed, wherein the metallization structures and the dielectric layer provide at least portions of a package substrate panel, and wherein the metallization structures comprise at least a portion of a frame extending at least partially along a perimeter of the package substrate panel and a mesh extending inwardly from the frame.

8. The method of claim 7, wherein the mesh comprises interconnected metal struts, and wherein portions of the dielectric layer are between the interconnected metal struts.

9. The method of claim 7, wherein the frame and the mesh comprise the metallization structures and second metallization structures.

10. The method of claim 9, wherein the second metallization structures are adjacent the conductive surface and the metallization structures extend from the second metallization structures and comprise the surfaces.

11. The method of claim 9, wherein the frame and the mesh comprise third metallization structures, wherein the second metallization structures are adjacent the conductive surface, the metallization structures extend from the second metallization structures, and the third metallization structures are on the metallization structures and comprise the surfaces.

12. The method of claim 7, wherein forming the dielectric layer comprises molding a molded dielectric layer over the metallization structures and removing a portion of the molded dielectric layer to expose the surfaces of the metallization structures.

13. The method of claim 7, wherein the dielectric layer comprises a thickness, and the frame extends through the thickness of the dielectric layer.

14. The method of claim 7, further comprising:
removing the carrier from the package substrate panel.

15. A method, comprising:
receiving a carrier comprising first and second conductive surfaces separated by a core;
patterning a plurality of first openings in a first resist layer over the first conductive surface;
forming first metallization structures in the first openings;
patterning a plurality of second openings in a second resist layer over the first conductive surface;
forming second metallization structures in the second openings;
molding, after removal of the first and second resist layers, a dielectric layer to encapsulate the first and second metallization structures;
removing a portion of the dielectric layer to expose the second metallization structures; and
removing the carrier from the first metallization structures and the dielectric layer to provide a package substrate, wherein the first and second metallization structures comprise a frame extending at least partially along a perimeter of the package substrate and a mesh extending inwardly from the frame.

16. The method of claim 15, wherein the mesh comprises interconnected metal struts, and wherein portions of the dielectric layer are between the interconnected metal struts.

17. The method of claim 15, wherein the dielectric layer comprises a thickness, and the frame extends through the thickness of the dielectric layer.

18. The method of claim 15, wherein the dielectric layer comprises an epoxy resin and the first metallization structures or the second metallization structures comprise one of copper, nickel, or gold.

19. The method of claim 15, wherein the first metallization structures are formed on third metallization structures adjacent the first conductive surface, the frame and mesh comprising the first, second, and third metallization structures.

20. The method of claim 15, wherein the package substrate comprises a package substrate panel comprising a plurality of individual package substrate units separated by the mesh.

* * * * *